(12) United States Patent
Yu et al.

(10) Patent No.: US 11,710,664 B2
(45) Date of Patent: Jul. 25, 2023

(54) SEMICONDUCTOR STRUCTURE WITH BACKSIDE VIA CONTACT AND A PROTECTION LINER LAYER

(71) Applicant: Taiwan Semiconductor Manufacturing Company, Ltd., Hsin-Chu (TW)

(72) Inventors: Li-Zhen Yu, New Taipei (TW); Chia-Hao Chang, Hsinchu (TW); Huan-Chieh Su, Changhua County (TW); Lin-Yu Huang, Hsinchu (TW); Cheng-Chi Chuang, New Taipei (TW); Yu-Ming Lin, Hsinchu (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 50 days.

(21) Appl. No.: 17/231,493

(22) Filed: Apr. 15, 2021

(65) Prior Publication Data
US 2022/0336287 A1    Oct. 20, 2022

(51) Int. Cl.
*H01L 21/8234* (2006.01)
*H01L 21/762* (2006.01)
(Continued)

(52) U.S. Cl.
CPC ........... *H01L 21/823431* (2013.01); *H01L 21/76224* (2013.01); *H01L 29/6681* (2013.01); *H01L 29/785* (2013.01); *H01L 29/7827* (2013.01)

(58) Field of Classification Search
CPC ....... H01L 21/823431; H01L 21/76224; H01L 29/6681; H01L 29/7827; H01L 29/785; H01L 21/28518; H01L 23/5286; H01L 21/76831; H01L 21/76897; H01L 29/42392; H01L 29/45; H01L 29/775; H01L 29/78696; H01L 29/66439; H01L 29/66545; H01L 21/823475; H01L 21/823481
See application file for complete search history.

(56) References Cited

U.S. PATENT DOCUMENTS 8,772,109 B2    7/2014  Colinge
8,785,285 B2    7/2014  Tsai et al.
(Continued)

*Primary Examiner* — Cuong B Nguyen
(74) *Attorney, Agent, or Firm* — Haynes and Boone, LLP

(57) ABSTRACT

A method includes receiving a substrate having a front surface and a back surface; forming an isolation feature of a first dielectric material in the substrate, thereby defining an active region surrounded by the isolation feature; forming a gate stack on the active regions; forming a first and a second S/D feature on the fin active region; forming a front contact feature contacting the first S/D feature; thinning down the substrate from the back surface such that the isolation feature is exposed; selectively etching the active region, resulting in a trench surrounded by the isolation feature, the second S/D feature being exposed within the trench; forming, in the trench, a liner layer of a second dielectric material being different from the first dielectric material; forming a backside via feature landing on the second S/D feature within the trench; and forming a backside metal line landing on the backside via feature.

20 Claims, 31 Drawing Sheets

(51) Int. Cl.
  *H01L 29/78*  (2006.01)
  *H01L 29/66*  (2006.01)

(56)  References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2021/0408249 A1* | 12/2021 | Yu .................. H01L 21/3065 |

* cited by examiner

SEMICONDUCTOR STRUCTURE WITH BACKSIDE VIA CONTACT AND A PROTECTION LINER LAYER

BACKGROUND

Integrated circuits have progressed to advanced technologies with smaller feature sizes, such as 7 nm, 5 nm and 3 nm. In these advanced technologies, the gate pitch (spacing) continuously shrinks and therefore induces contact to gate bridge concern. Furthermore, three dimensional transistors with fin-type active regions are often desired for enhanced device performance. Those three-dimensional field effect transistors (FETs) formed on fin-type active regions are also referred to as FinFETs. Other three-dimensional field-effect transistors include gate-all-around FETs. Those FETs are required narrow fin width for short channel control, which leads to smaller source/drain regions than those of planar FETs. This will reduce the alignment margins and cause issues for further shrinking device pitches and increasing packing density. Along with the scaling down of the device sizes, power lines are formed on the backside of the substrate. However, the existing backside power rails still face various challenges including shorting, leakage, routing resistance, alignment margins, layout flexibility, and packing density. Therefore, there is a need for a structure and method for fin transistors and power rails to address these concerns for enhanced circuit performance and reliability.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
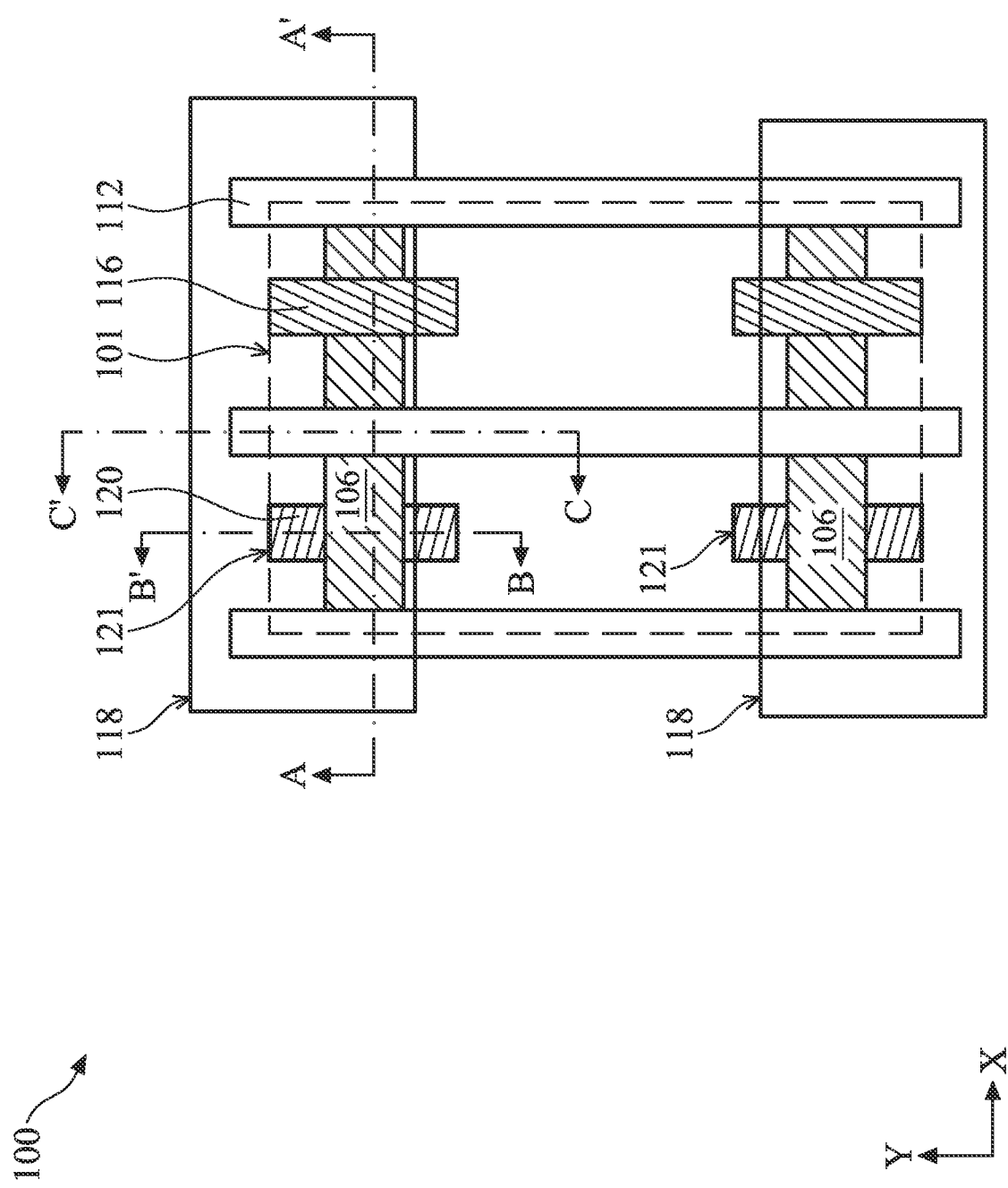
FIG. 1 is a top view of a semiconductor structure constructed according to some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure provides a semiconductor structure with backside power rails and the method making the same. The semiconductor structure includes a backside via (backside via contact or VB) feature disposed on the back side of the substrate and interposed between the active regions and the backside power rails. Especially, a liner is formed on the backside via to function as etch stop layer to prevent damage to the inner spacer and the backside interlayer dielectric layer, thereby eliminating the short issue. The backside via features electrically connect the backside power rails to the active regions, such as connecting a backside power rail to a source feature of a field-effect transistor (FET). The semiconductor structure also includes an interconnect structure formed on the front side of the substrate. The interconnect structure further includes a front contact feature electrically connects to the FETs, such as landing on and connecting to a drain feature of a transistor. In some embodiments, both front and backside contact features include silicide to reduce contact resistance. Such formed semiconductor structure includes backside power rails on the back side and the interconnect structure on the front side to collectively route power lines, such as the drain features being connected to the corresponding power lines through the interconnect structure and source features being connected to the corresponding power lines through the backside power rails. The disclosed structure and the method making the same are applicable to a semiconductor structure having FETs with a three-dimensional structure, such as fin FETs (FinFETs) formed on fin active regions, and FETs with vertically-stacked multiple channels.

Figure 2:
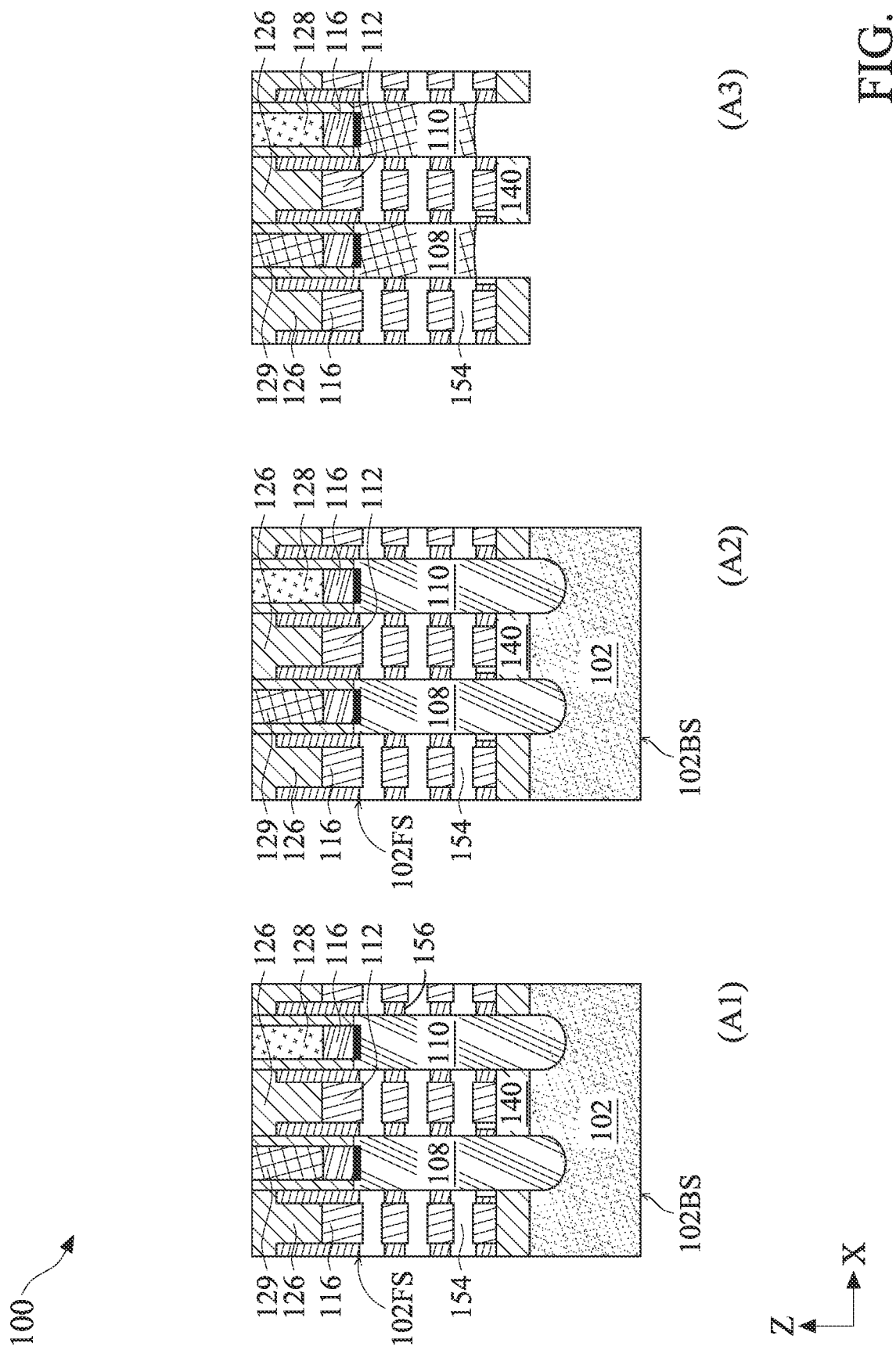
FIG. 2 illustrates sectional views of the semiconductor structure at various stages constructed according to some embodiments.
Figure 2:
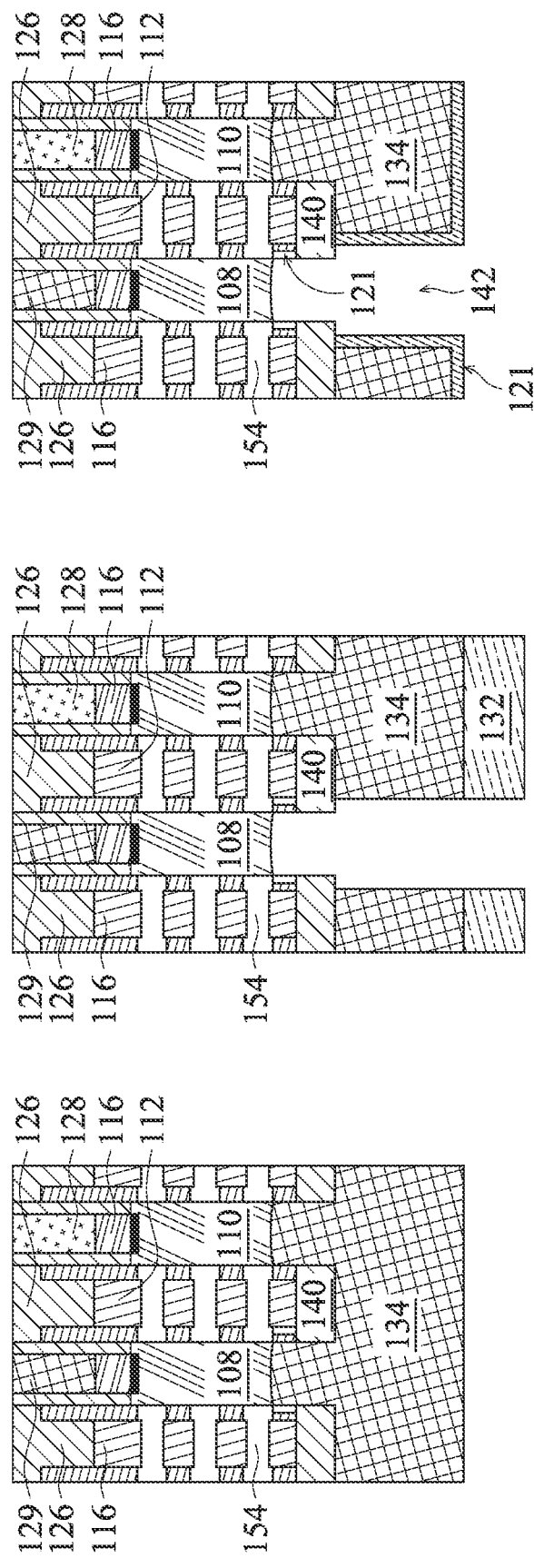
Figure 2:
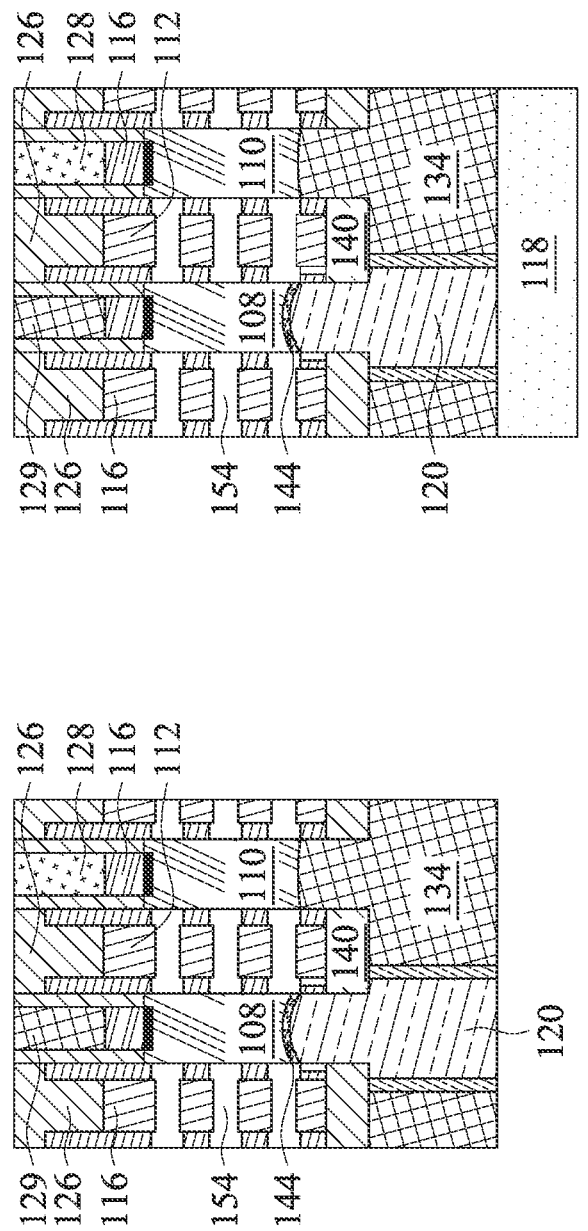
Figure 2:
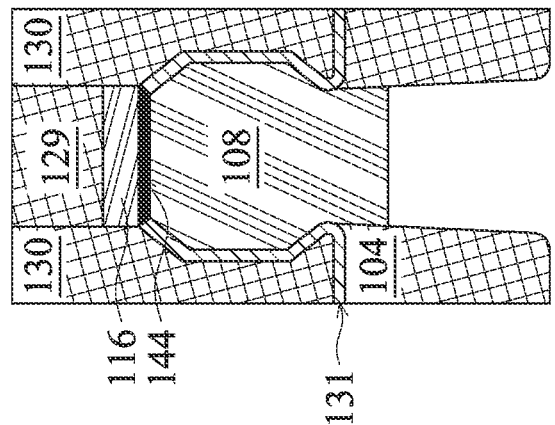
Figure 2:
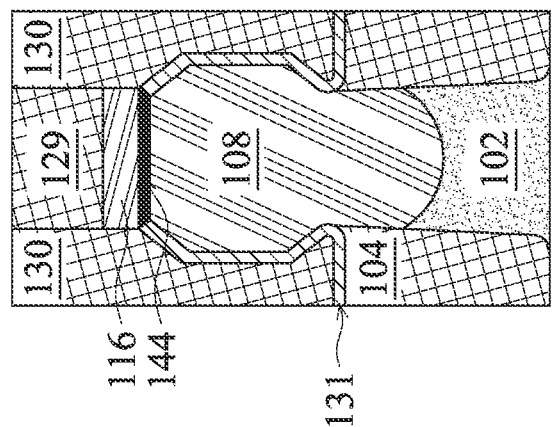
Figure 2:
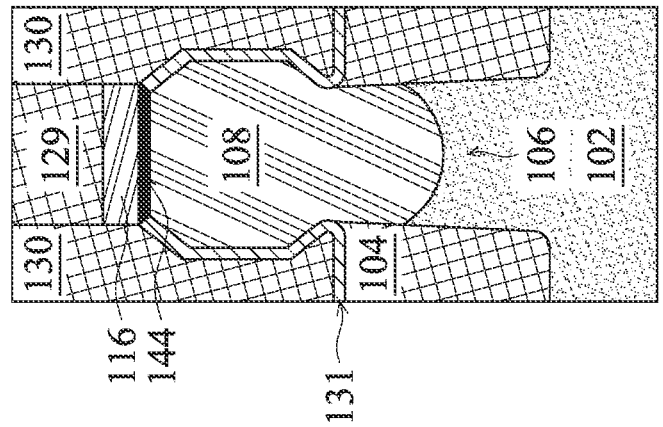
Figure 2:
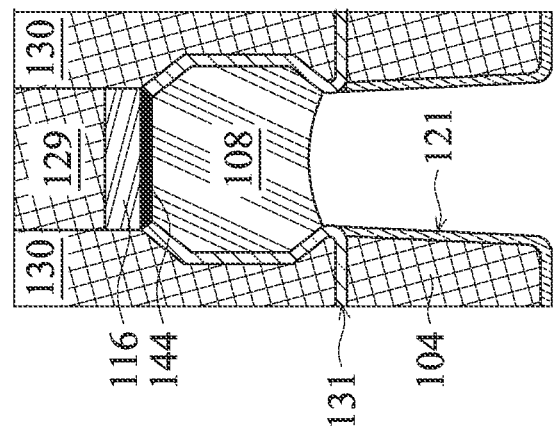
Figure 2:
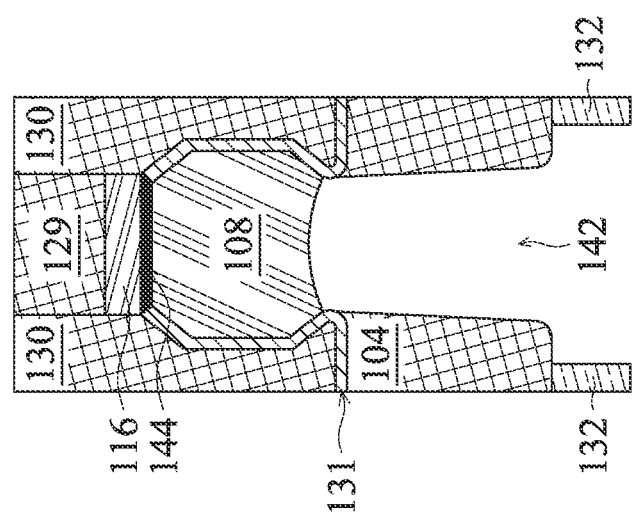
Figure 2:
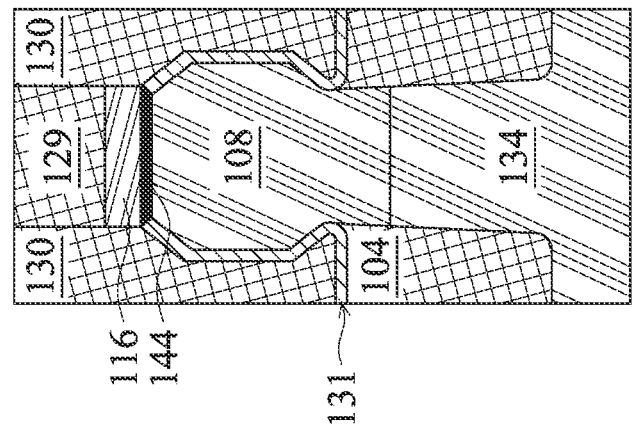
Figure 2:
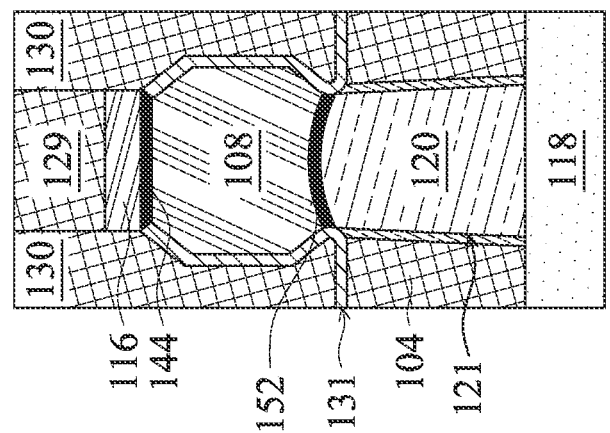
Figure 2:
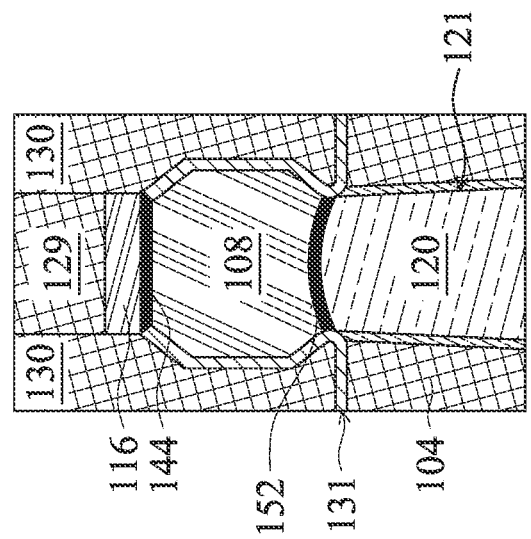
Figure 2:
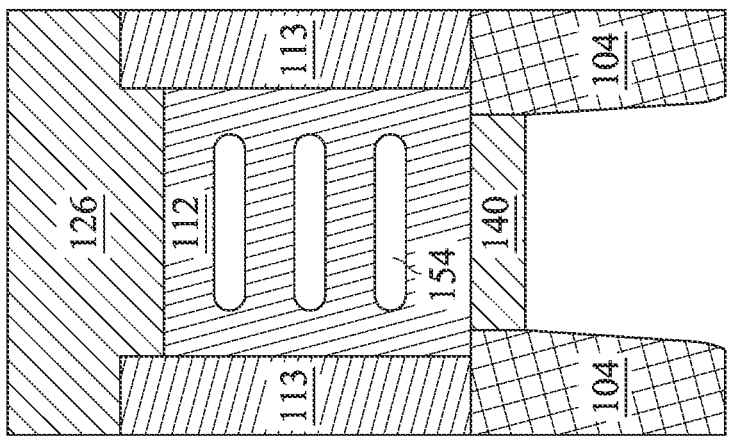
Figure 2:
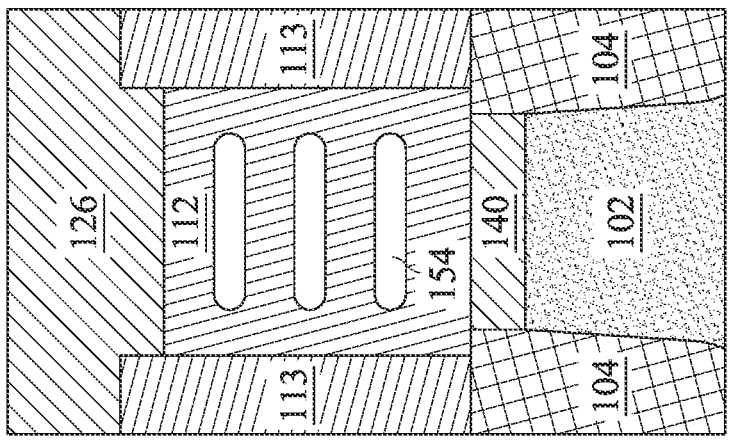
Figure 2:
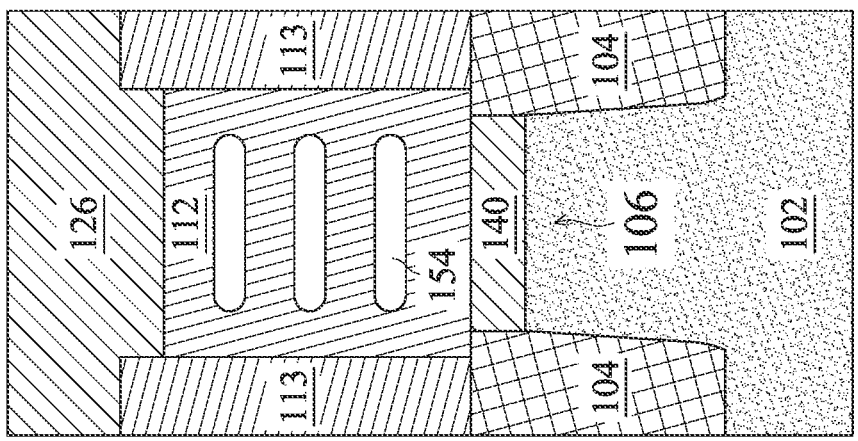
Figure 2:
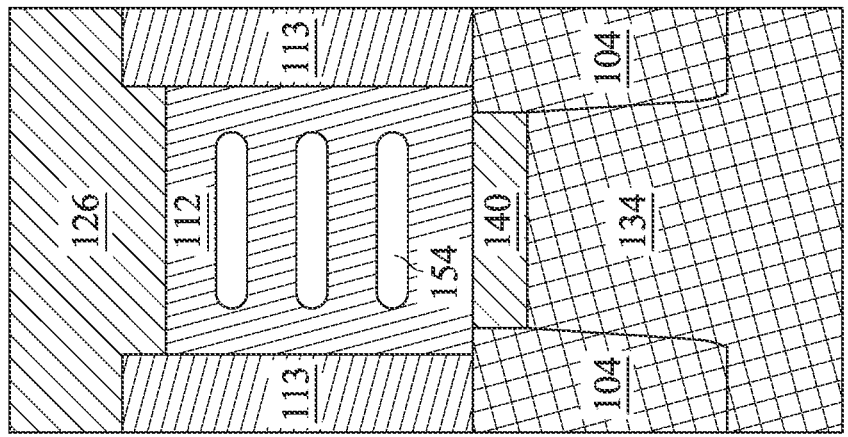
Figure 2:
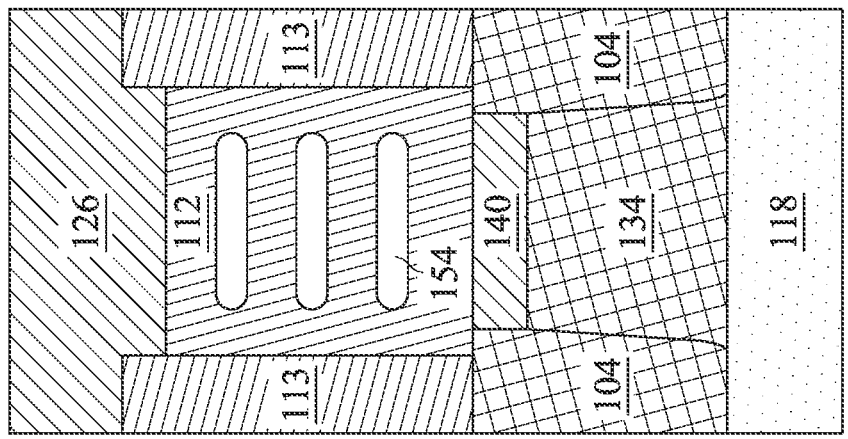

FIG. 1 is a top view of a semiconductor structure (or workpiece) 100 constructed according to some embodiments. FIG. 2 illustrates sectional views of the semiconductor structure 100 constructed according to some embodiments. Especially, A1~A8; B1~B8; and C1~05 in FIG. 2 are sectional views of the semiconductor structure 100 along the dashed lines AA', BB', and CC' of FIG. 1, respectively.

Referring to FIG. 1 and A1, B1 and C1 of FIG. 2, the semiconductor structure 100 includes a substrate 102, active regions 106, and shallow trench isolation (STI) features 104 isolate the active regions from each other. The substrate 102 includes silicon. The substrate 102 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In one embodiment, the substrate 102 includes various doped features for various microelectronic components, such as a complementary metal-oxide-semiconductor field-effect transistor (CMOSFET), imaging sensor, memory cell, and/or capacitive element.

In some embodiments, the active regions 106 are fin active regions extruded above the STI features 104. In some embodiments, the active regions 106 may be alternatively planar active regions or active regions with vertically-stacked multiple channels (such as gate-all-around (GAA) structure). FIG. 2 illustrates active regions with vertically-stacked multiple channels as an example. In the present embodiment, a plurality of silicon (Si) films and silicon germanium (SiGe) films alternatively stacked on the substrate 102 and are formed by epitaxially growth. The active regions 106 are formed by patterning the alternative Si and SiGe films to form trenches; filling the trenches with one or more dielectric material, such as silicon oxide; and performing a chemical mechanical polishing (CMP) process. The dielectric material in the trenches forms STI features 104. An etching process may be additionally applied to selectively etch back the dielectric material such that the active regions 106 are extruded above the STI features 104.

In some embodiments, the semiconductor structure 100 also includes a bottom dielectric layer (also referred to as bottom self-aligned contact layer or bottom SAC layer) 140 inserted between the plurality of Si and SiGe films and the substrate 102 to provide etch selectivity and benefits the backside operations. In some embodiments, the bottom SAC layer 140 may include one or more dielectric material, such as silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbon nitride (TaCN), silicon nitride (SiN), silicon oxycarbonitride (SiOCN), zirconium nitride (ZrN), silicon carbonitride (SiCN), or a combination thereof. The bottom SAC layer 140 may have a thickness ranging between 10 nm and 50 nm, a width ranging between 5 nm and 30 nm. The bottom SAC layer 140 may be formed by a suitable technology, such as oxygen implantation to introduce oxygen into the substrate 102, forming silicon oxide therein.

The bottom SAC layer 140 can be formed by any suitable procedure. The procedure starts by epitaxially growing a thicker silicon germanium layer and a thin silicon layer on the thicker silicon germanium layer and alternative SiGe/Si stack on the substrate; and then the thicker SiGe layer is replaced by a dielectric material at later stages. The thicker SiGe layer has a Ge concentration different from that of the SiGe films in the SiGe/Si stack to achieve etch selectivity. In some embodiments, the procedure further includes etching to recess S/D regions to form S/D recesses; performing a selective etching process to etch the SiGe films of the SiGe/Si stack to form lateral recesses at edges the SiGe films of the SiGe/Si stack; forming inner spacers by deposition and anisotropic etching; performing a second selective etching process to etch the thicker SiGe layer to form a lateral recess; and filling one or more dielectric material by deposition to form the bottom SAC layer 140. Since the thicker SiGe layer and the SiGe films of the SiGe/Si stack have different Ge concentrations and etch rates are also different accordingly. For example, the thicker SiGe layer includes a Ge concentration less than that of the SiGe films of the SiGe/Si stack. The etchant in the first selective etching process is chosen to have a greater etch rate to the SiGe films of the SiGe/Si stack. The etchant in the second selective etching process is performed while the SiGe films of the SiGe/Si stack are protected by the inner spacers. In some alternative embodiments, instead of removing the thicker SiGe layer and filling dielectric material but performing an oxidation process to the thicker SiGe layer to convert it into a SiGe oxide as the bottom SAC layer 140.

The semiconductor structure 100 also includes sources (or referred to as source features) 108, drains (or referred to as drain features) 110, and gate stacks 112 disposed on the active regions 106. The source features 108 and the drain features 110 are interposed by respective gate stacks 112 to form field-effect transistors (FETs) with vertically-stacked multiple channels 154. According to the present embodiment, in the top view, the active regions 106 have elongated shape oriented along the first direction (X direction) and the gate stacks 112 have elongated shape oriented along the second direction (Y direction) that is substantially orthogonal to the first direction. A direction perpendicular to both the X and Y directions is referred to Z direction.

The gate stacks 112 are formed by deposition and patterning, which further includes a lithography process and etching. In the present embodiment, the gate stacks 112 are formed by a gate-last procedure. In the gate-last procedure, dummy gate stacks are first formed by deposition and patterning; gate spacers 113 of one or more dielectric material are formed on sidewalls of the dummy gate stacks by deposition and anisotropic etching (such as plasma etching); then the source features 108 and drain features 110 are formed on edges of the dummy gate stacks; an interlevel dielectric (ILD) layer 130, or additionally an etch stop layer 131, is formed thereon by deposition and CMP; the dummy gate stacks are removed by selective etching, resulting in gate trenches in the ILD layer 130; SiGe films in the alternative Si and SiGe films are selectively removed, such as by another etching process that selectively etch SiGe to expose Si films as vertically-stacked channels 154; and then the gate stacks 112 are formed in the gate trenches to surround the multiple channels 154. The gate stacks 112 each include a gate dielectric layer and a gate electrode disposed on the gate dielectric layer. In some embodiments, the gate dielectric layer includes a high-k dielectric material (such as metal oxide, metal nitride or a combination thereof), and may additional include an interfacial layer (such as silicon oxide). The gate electrode includes metal and may include multiple films, such as a capping layer, a work function metal layer and a filling metal layer. The gate spacers 113 may include one or more dielectric material, such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN or a combination thereof. The gate spacers 113 may have a thickness ranging between 1 nm and 40 nm.

The source features 108 and the drain features 110 are formed by etching to recess source/drain regions and epitaxially growing to form source features 108 and drain features 110. Especially, the etching process to recess the source/drain regions continuously etch through the alternatively stacked Si films and SiGe films in the source/drain regions such that the sidewalls of the Si and SiGe films are exposed in the recesses. Furthermore, another etching process is applied to laterally recess the SiGe films, resulting in dents. Inner spacers 156 of one or more dielectric material layer are formed in the dents by a suitable procedure, such as deposition and anisotropic etching. The inner spacers 156 provide isolation between the gate stacks 112 and the source/drain features and also provide protection to the source/drain features during the formation of the gate stacks 112 in the gate-last process.

The substrate 102 has a front side 102FS and a backside 102BS. The gate stacks 112, the source features 108 and the drain features 110 are formed on the front side of the substrate 102. An interconnect structure is further formed on the front side 102FS of the substrate 102. The interconnect structure includes various contact features 116, via features and metal lines to connect FETs and other devices. The interconnect structure includes multiple metal layers each have a plurality of metal lines and via features to vertically interconnect the metal lines in the adjacent metal layers, such as metal lines in the first metal layer and via features 128 connecting the metal lines to the contact features 116. The contact features 116 include one or more conductive material, such as W, Ru, Co, Cu, Ti, TiN, Ta, TaN, Mo, Ni, or a combination thereof. The contact features 116 may have a thickness ranging between 1 nm and 50 nm. Similarly, the via features 128 include one or more conductive material, such as W, Ru, Co, Cu, Ti, TiN, Ta, TaN, Mo, Ni, or a combination thereof. The via features 128 may have a thickness ranging between 1 nm and 50 nm. In the present embodiment, the contact features 116 are also referred to as front contact features as being formed on the front side of the substrate 102. Especially, at least a subset of the front contact features 116 are landing on the drain features 110 and at least a subset of the via features 128 are landing on the contact features 116. In the present embodiment, the contact feature 116 further includes a silicide film 144, such as nickel silicide or cobalt silicide, directly formed on the drain features 110 to reduce to the contact resistance. The formation of the silicide film 144 may include deposition or alternatively a procedure that includes metal deposition; thermal annealing to react the metal with silicon to form silicide; and etching to remove unreacted metal. In some embodiments, the contact features 116 are formed on the source features 108 but not electrically connected to any power line through the corresponding contact features 116. Those front contact features 116 formed on the source features 108 are dummy features and are not landed thereon by the via features 128. Instead, a dielectric material layer 129 is formed thereon as illustrated in (A1) of FIG. 2. This dielectric material layer 129 is aligned to the contact features 116 disposed on the source features 108 and may be formed by a self-aligned contact (SAC) process. The dielectric material layer 129 includes one or more dielectric material, such as silicon oxide, silicon nitride, silicon oxynitride or a combination thereof.

Another dielectric material layer 126 is formed on the top of the gate stacks 112. Similarly, the dielectric material layer 126 is aligned to the gate stacks 112 and may be formed by another self-aligned contact process. The dielectric material layer 126 is also referred to as self-aligned contact (SAC) layer 126. The SAC layer 126 includes one or more dielectric material, such as silicon oxide, silicon nitride, silicon oxynitride or a combination thereof, and is different from the dielectric material layer 129 in composition to provide etch selectivity. In some embodiments, the SAC layer 126 includes SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or a combination thereof. The SAC layer 126 have a suitable thickness that is thick enough to resist etching and is thin enough without substantially impacting the dimension and performance of the corresponding gate stack. In some examples, the SAC layer 126 has a thickness ranging between 10 nm and 50 nm; and has a width ranging between 5 nm and 30 nm. The SAC layer 126 may be formed by selective deposition or other suitable process. In some embodiments, the SAC layer 126 may be formed by a procedure that includes selective etching to remove gate hard mask, depositing a dielectric material, and performing a CMP process. In some embodiments, the SAC layer 126 may be formed by a procedure that includes etching back the gate stacks, etching to the gate spacers to pull back the gate spacer, depositing a dielectric material, and performing a CMP process. Various SAC layers (126 or 129) are formed by any suitable process. In some embodiments, the formation of a SAC layer includes performing a selective etching process to recess the material to form a recess; depositing a SCA material to fill the recess; and performing a CMP process to remove the excessive material and planarize the top surface. In some other embodiments, the formation of a SAC layer includes performing a selective etching process to recess the material to form a recess; and performing a bottom-up deposition to selectively deposit a SCA material to fill the recess.

The operations on the front side 102FS may further include packaging (such as forming passivation layer and etc.) and bonding another substrate on the front side of the workpiece, according to some embodiments. Then the process proceeds to various operations on the backside of the workpiece.

Referring to A2, B2, and C2 of FIG. 2, the substrate 102 is thinned down from the backside by suitable technologies, such as grinding, CMP, etching, or a combination thereof. In some embodiments, the thinning-down process continues until the STI features 104 are exposed from the backside of the workpiece.

Referring to A3, B3, and C3 of FIG. 2, an etching process is applied to selectively etch active regions 106 relative to the STI features 104 and the bottom SAC layer 140. In the present embodiment, the etching process is designed to etch silicon without significant etching to the STI features 104 and the bottom SAC layer 140. Thus, the bottom SAC layer 140 functions as a protection layer so that the etching process will not damage to gate stacks 112 and the channels 154. The etching process may include wet etch, dry etch, or a combination thereof. In some embodiments, the etching process uses an etchant including Potassium hydroxide (KOH) solution to selectively etch silicon. After the etching process, trenches are formed and the source and drain features are exposed within the trenches from the backside.

Referring to A4, B4, and C4 of FIG. 2, a dielectric material layer 134 is deposited to refill the trenches and cover the backside of the workpiece. A CMP process may be additionally applied to planarize the backside surface after the deposition. The dielectric material layer 134 includes a suitable dielectric material, such as silicon oxide, silicon nitride, silicon oxynitride, other suitable dielectric material, or a combination thereof. The dielectric material layer 134 may be different from that of the STI features 104 to provide etch selectivity for the subsequent etching.

Referring to A5 and B5 of FIG. 2, a patterning process is applied to the workpiece such that a subset of the source and drain features are exposed. In the present embodiment, the source features 108 are exposed while the drain features 110 remain covered by the dielectric material layer 134 after the patterning process. The patterning process includes lithography process and etching. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as mask-less photolithography, electron-beam writing, and ion-beam writing. After the lithography process, a patterned photoresist layer 132 with openings that defines regions (such as those regions of the source features 108 in the present embodiment) for etching. Then, an etching process is performed to the workpiece to form backside openings 142 so that the source features 108 are exposed within the backside openings 142 while the drain features 110 remain covered by the dielectric material layer 134. The etching process may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density.

In some embodiments, a hard mask may be further used. In furtherance of the embodiments, a hard mask with a suitable material such as silicon oxide, silicon nitride or a combination thereof, is deposited on the workpiece before the photoresist coating. After the patterned photoresist layer is formed on the hard mask, an etching process is performed to open the hard mask layer, thereby transferring the pattern from the photoresist layer to the hard mask layer. The remaining photoresist layer may be removed after the patterning the hard mask layer. The etching process to pattern the hard mask layer may include wet etching, dry etching or a combination thereof. The etching process may include multiple etching steps. For example, the silicon oxide film of the hard mask layer may be etched by a diluted hydrofluoric acid solution and the silicon nitride film of the hard mask layer may be etched by a phosphoric acid solution. Then another etching process may be followed to etch the dielectric material layer 134 not covered by the patterned hard mask layer to form backside openings 142. The patterned hard mask layer is used as an etch mask during the etching process.

Referring to A6 and B6 of FIG. 2, a liner layer 121 is formed on the sidewalls of the backside openings 142. The liner layer 121 includes a material different from those of the STI features 104, the dielectric material layer 134 and the inner spacers 156 so that the etching process can be effectively stopped without damaging those materials. Especially, the STI features 104 and the inner spacers 156 are exposed in the backside openings 142. In some embodiments, the STI features 104, the dielectric material layer 134 and the inner spacers 156 include silicon oxide while the liner layer 121 includes silicon nitride or oxynitride. The liner layer 121 extends from the backside surface of the STI features 104 to the sidewalls of the backside openings 142 and further extends to the exposed sidewalls of the bottom SAC layer 140 and the sidewalls of the inner spacers 156 in the backside openings 142. In some embodiments, the liner layer 121 includes SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN or a combination thereof. The liner layer 121 has a suitable thickness that is thick enough to effectively constrain the pre-cleaning processes from damaging the materials to be protected (such as the inner spacers 156 and the STI features 104) and is thin enough such that the sizes of the VB features 120 are not substantially reduced and the corresponding resistances are not degraded. For example, the liner layer 121 has a thickness ranging between 5 nm and 20 nm.

The liner layer 121 is formed by a thermal treatment with nitrogen-containing gas. In some embodiments, $N_2$, $NH_3$, or both gases are used for nitridation at an elevated treatment temperature, such as a treatment temperature ranging between about 200° C. and 500° C. The treatment pressure may range between about 0.01 and 2 atm. In some embodiments, $O_2$, $N_2$, $NH_3$, or a combination thereof are used for oxidation and nitridation with a treatment temperature ranging between about 200° C. and 500° C., and with a treatment pressure ranging between about 0.01 and 2 atm. In some embodiments, $O_2$ gas and $N_2/NH_3$ gas are sequentially used for oxidation and nitridation for dual-film liner A and B with a treatment temperature ranging between about 200° C. and 500° C., and with a treatment pressure ranging between about 0.01 atm and 2 atm.

Referring to A7 and B7 of FIG. 2, backside via (VB) features 120 are formed in the backside openings 142 by a suitable process such as deposition and CMP. The VB features 120 are electrically connected to the source features 108 from the backside surface of the source features 108. In the present embodiment, a suicide layer 152 is formed on the backside surface of the source features 108 to reduce contact resistance. The formation of the VB features 120 is further described according to some embodiments.

A first pre-cleaning process, prior to silicide formation, is applied to remove oxide and other contamination formed on the backside surface of the source features 108 by a suitable solution, such as aqueous HF (hydrofluoric acid), other suitable cleaning solution, or a combination thereof. Thereafter, the silicide layer 152 is formed on the backside surface of the source features 108. The formation of the silicide layer 152 is similar to the formation of the silicide film 144. For example, the silicide layer 152 may be formed by a procedure that includes deposition, annealing and etching. The silicide layer 152 may include nickel silicide, cobalt silicide, other suitable silicide, or a combination thereof.

A second pre-cleaning process, prior to VB formation, is applied to various contamination by a suitable solution, such as aqueous HF; ammonia-hydrogen peroxide-water mixture; hydrochloric acid-hydrogen peroxide-water mixture; sulfuric peroxide mixture; other suitable cleaning solution; or a combination thereof applied sequentially. Thereafter, VB features 120 are formed on the backside of the source features 108 in the backside openings 142, such as formed on the silicide layer 152. The formation of the VB features 120 includes metal deposition and CMP according to some embodiments. For example, the metal deposition may include physical vapor deposition (PVD), chemical vapor deposition (CVD), plating, atomic layer deposition (ALD), other suitable deposition, or a combination thereof. The VB features 120 includes one or more suitable conductive materials, such as copper, aluminum, tungsten, other suitable metal or metal alloy, or a combination thereof. In some embodiments, the VB features 120 includes tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), or a combination thereof, and may have a thickness ranging between 1 nm and 50 nm. Furthermore, the VB features 120 may include a barrier layer disposed on the liner layer 121 in the backside openings 142 and surrounding the bulk metal of the VB features 120. The barrier layer includes a different composition and has a different function than the liner layer 121. For example, the barrier layer prevents the metal of the VB features 120 from diffusing into the surrounding dielectric materials and may include Ti, TiN, Ta, TaN, or a combination thereof. The bulk metal of the VB features 120 may include W, Ru, Co, Cu, Mo, Ni or a combination thereof.

The liner layer 121 provides various advantages to the formation of the VB features 120. Especially, the pre-cleaning processes are etching processes applied to various materials exposed in the backside openings 142. For example, the inner spacers 156 are exposed in the backside openings 142 and susceptible to the pre-cleaning solutions. The liner layer 121 functions as an etch stop layer to prevent those materials from being damaged and avoids various concerns, such as short issues and other material loss.

Referring to A8, B8 and C5 of FIG. 2, one or more backside metal line (or backside power rail) 118 is formed, landing on the corresponding VB feature 120 and electrically connecting to the corresponding source feature 108. The backside metal line 118 includes one or more conductive material, such as Ti, TiN, TaN, Co, W, Al, Cu, or combination thereof. The operation to form the backside metal line 118 may include a damascene process according to some embodiments. In the damascene process, a backside ILD (BILD) layer is formed on the backside of the workpiece by a suitable procedure, such as deposition and CMP. The BILD layer is similar to the ILD layer on the front side of the workpiece and includes one or more dielectric materials, such as silicon oxide, silicon nitride, silicon oxynitride, low-k dielectric material, other suitable dielectric material or a combination thereof. The BILD layer may be formed by a suitable process, such as deposition. For example, the deposition includes flowable CVD, CVD, other suitable deposition technologies, or a combination thereof. The formation of the BILD layer may additionally include a CMP process to planarize the surface. Then one or more trenches are formed in the BILD layer by lithography process and etching, such that the VB features 120 are exposed through the trenches. A hard mask may be used to pattern the BILD layer. An etching process is applied to etch through the BILD layers until the VB features 120 are exposed. Then the conductive material is deposited into the trenches to form the VB features 120. The deposition process may include PVD, plating, other suitable deposition technologies or a combination thereof. A CMP process may be additionally applied thereafter to remove the excessive metal deposited on the backside surface of the BILD layer. Especially, the backside metal line 118 is designed and configured to be electrically connected to the FET through the VB feature 120, such as connecting to the source feature 108 of the FET in the present embodiment. Other fabrication steps may be implemented before, during and after the operations of the method.

Figure 3:
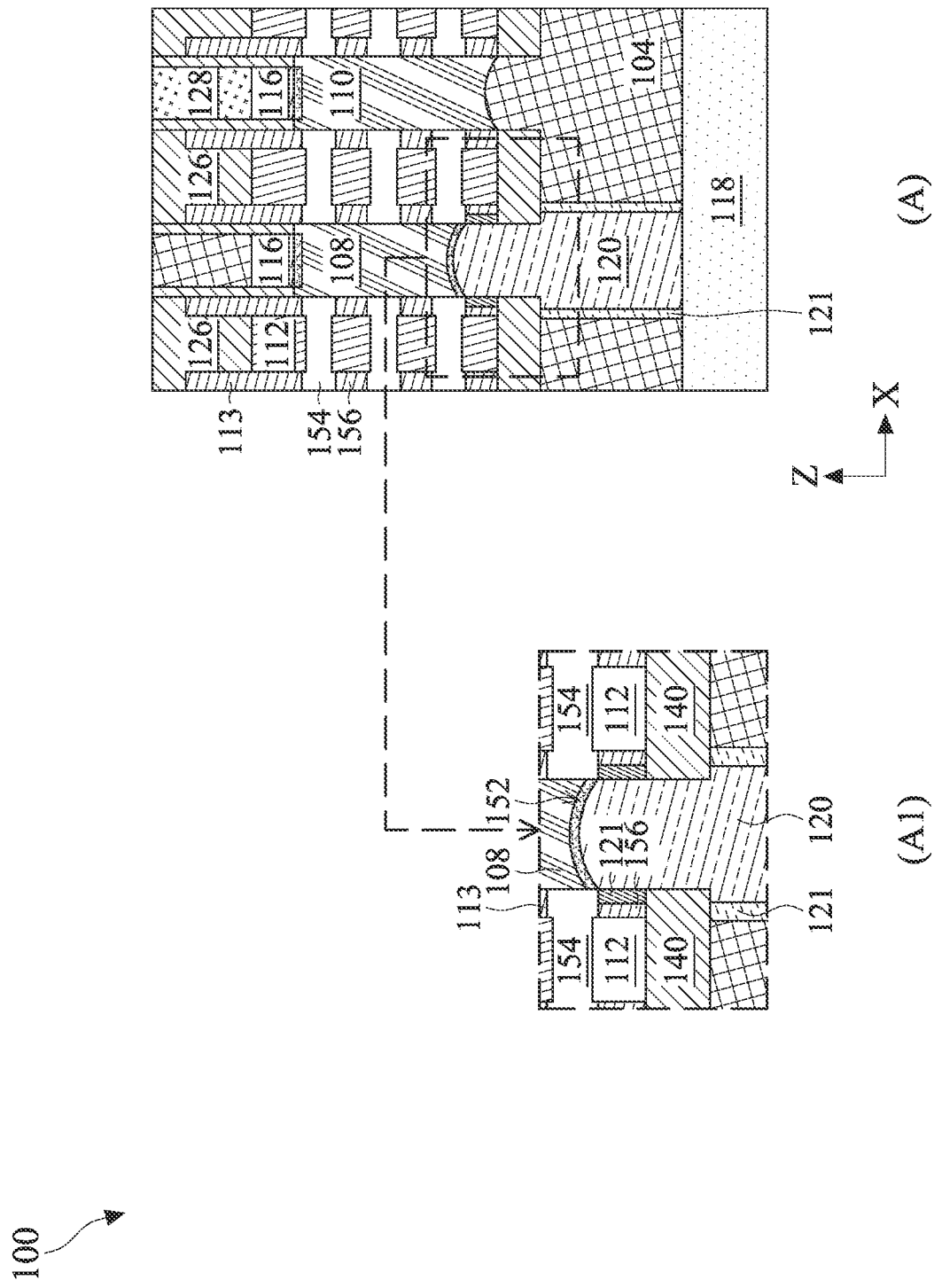
FIG. 3 illustrates sectional views of the semiconductor structure constructed according to some embodiments.
Figure 3:
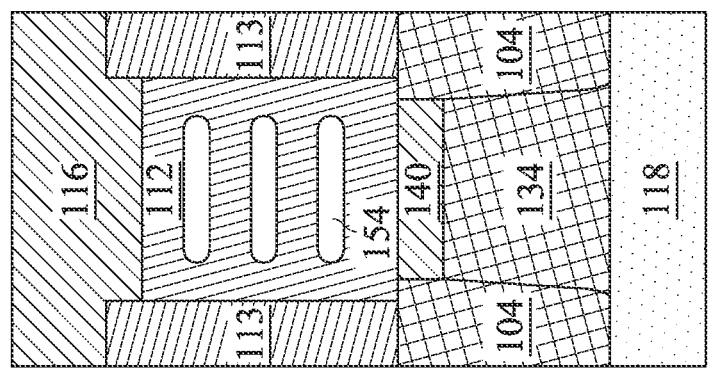
Figure 3:
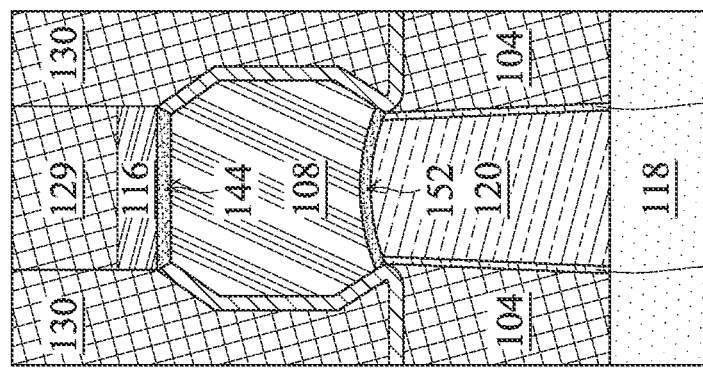

The semiconductor structure 100 is further illustrated with various sectional views (A), (B) and (C) in FIG. 3, the portion of the semiconductor structure 100 in (A) of FIG. 3 is further enlarged and illustrated in (A1) of FIG. 3. In the described structure, the liner layer 121 is disposed on sidewalls of the backside via feature 120. The liner layer 121 directly contacts both the backside via feature 120 and the STI feature 104. However, the liner layer 121 is different from the STI feature 104 in composition to achieve etch selectivity. Furthermore, the liner layer 121 is formed on the sidewalls of the STI feature 104 and the sidewalls of lower inner spacers 156, as illustrated in (A) and (A1) of FIG. 3. Thus, the liner layer 121 can effectively protect the inner spacers 156 and the STI feature 104 from damaging during subsequent cleaning process, such as pre-silicide cleaning and pre-VB cleaning. As illustrated in (B) of FIG. 3, the liner layer 121 is extending up to the etch stop layer 131 and may further contact the silicide layer 152 formed on the bottom surface of the source feature 108. It is noted that the liner layer 121 is only formed in the location aligned with source feature 108 and may directly contact the source feature 108 but it is absent from the drain feature 110.

Figure 4:
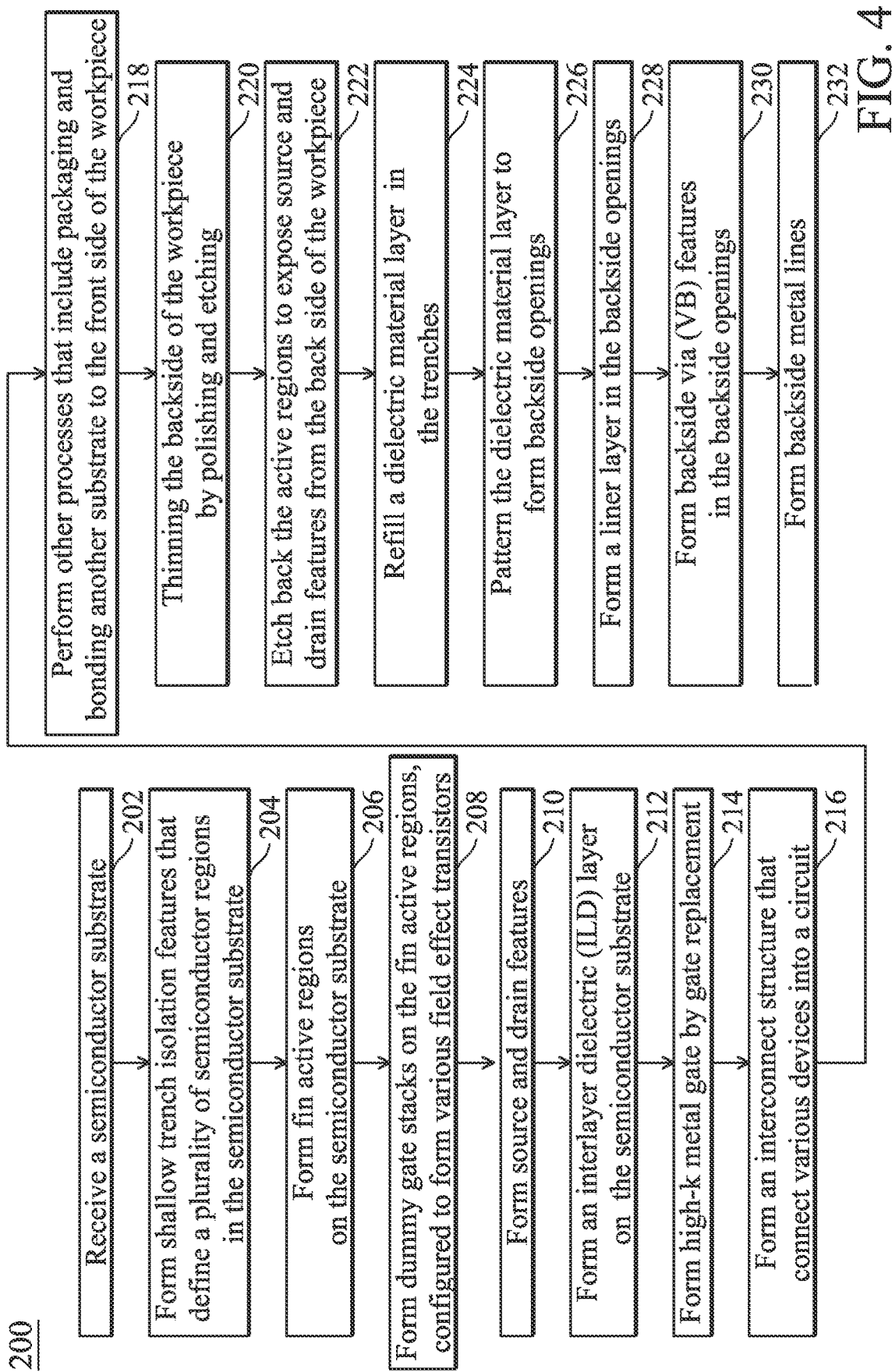
FIG. 4 is a flowchart of a method making the semiconductor structure of FIGS. 1, 2 and 3 constructed according to some embodiments.

FIG. 4 is a flowchart of a method 200 of making the semiconductor structure 100 constructed in accordance with some embodiments. The method 200 begins with a block 202 by receiving a substrate 102. In the present embodiment, the substrate 102 includes a plurality of Si films and SiGe films alternatively stacked, which may be formed by epitaxial growth.

The method 200 includes some operations (such as 204-218) applied on the front side of the workpiece and some operations (such as 220-232) applied to the back side of the workpiece. Those operations are described with reference to FIGS. 1, 2 and 4. Particularly, the method 200 includes following operations on the front side of the workpiece: an operation 204 to form STI features 104 on the substrate 102; an operation 206 to form active regions 106; an operation 208 to form dummy gate stacks on the active regions; an operation 210 to form source features 108 and drain features 110; an operation 212 to form an ILD layer 130; an operation 214 to form gate stacks 112 with gate dielectric of high-k dielectric material and gate electrode of metal; and an operation 216 to form an interconnect structure that includes contact features, via features and metal lines. The method 200 may include other operations 218 applied to the front side of the workpiece, such as packaging and bonding another substrate to the front side of the workpiece. The method 200 proceeds to various operations on the back side of the workpiece.

The method 200 includes an operation 220 to thin down the workpiece from the backside, as illustrated in A2, B2 and C2 of FIG. 2. The operation 220 may include grinding, CMP and etch in a combination to make thinning process efficient. The operation 220 may stop on the STI features 104. The method 200 also includes an operation 222 to selectively etch back the semiconductor material (silicon in the present embodiment) of the fin active regions 106, resulting in trenches such that the source features 108 and drain features 110 are exposed within the trenches from the back side. As illustrated in A3 of FIG. 2, the lowest inner spacers 156 are also exposed. The bottom SAC layer 140 can protect the gate stacks 112 and channels 154 from damaging during the following etching processes.

The method 200 includes an operation 224 to refill a dielectric material layer 134 to the trenches. The operation 224 may include a suitable deposition, such as flowable CVD (FCVD) process, or a suitable deposition followed by CMP. The dielectric material layer 134 may be different from or alternatively same to that of the STI features 104 and may include a dielectric material, such as silicon oxide, silicon nitride or a combination thereof. The method 200 proceeds to an operation 226 to pattern the dielectric material layer 134 to form backside openings 142 such that to expose a subset of the source and drain features in the backside openings 142. In the present embodiment, the source features 108 are exposed in the backside openings 142 while the drain features 110 remain covered by the dielectric material layer 134. When the dielectric material layer 134 is the same to that of the STI features 104, such as both including silicon oxide, then the patterning process in the operation 226 patterns both the dielectric material layer 134 and the STI features 104 to form the backside openings 142.

The method 200 includes an operation 228 to form a liner layer 121 in the backside openings 142. The operation 228 includes a thermal treatment with nitrogen-containing gas. In some embodiments, $N_2$, $NH_3$, or both gases are used for nitridation at an elevated treatment temperature, such as a treatment temperature ranging between about 200° C. and 500° C. The treatment pressure may range between about 0.01 and 2 atm. In some embodiments, $O_2$, $N_2$, $NH_3$, or a combination thereof are used for oxidation and nitridation with a treatment temperature ranging between about 200° C. and 500° C., and with a treatment pressure ranging between about 0.01 and 2 atm. In some embodiments, $O_2$ gas and $N_2/NH_3$ gas are sequentially used for oxidation and nitridation for dual-film liner A and B with a treatment temperature ranging between about 200° C. and 500° C., and with a treatment pressure ranging between about 0.01 and 2 atm.

The method 200 proceeds to an operation 230 to form VB features 120 landing on the source features 108. The operation 230 may include deposition and CMP. In some embodiments, the operation 230 includes pre-silicide cleaning; forming silicide layer 152; pre-metal cleaning; metal deposition; and CMP. The pre-cleaning process (pre-silicide cleaning or pre-metal cleaning) may include wet etching using hydrofluoric acid; dry etching using carbon and fluorine containing gas (such as $CF_4$) and argon; or a combination thereof.

The method 200 proceeds to an operation 232 to form backside metal lines 118 landing on the VB features 120. The backside metal lines 118 electrically connected to the source features 108 through the VB features 120. The backside metal lines 118 may be configured to function as backside power rails to provide electrical bias to the source features 108. The method 200 may further include other operations, such as fabricating bonding pads on the backside of the workpiece such that all metal lines (both on the front side and the back side) are routed to the backside bonding pads for assembling the corresponding chips on the circuit boards or circuit modules.

Figure 5:
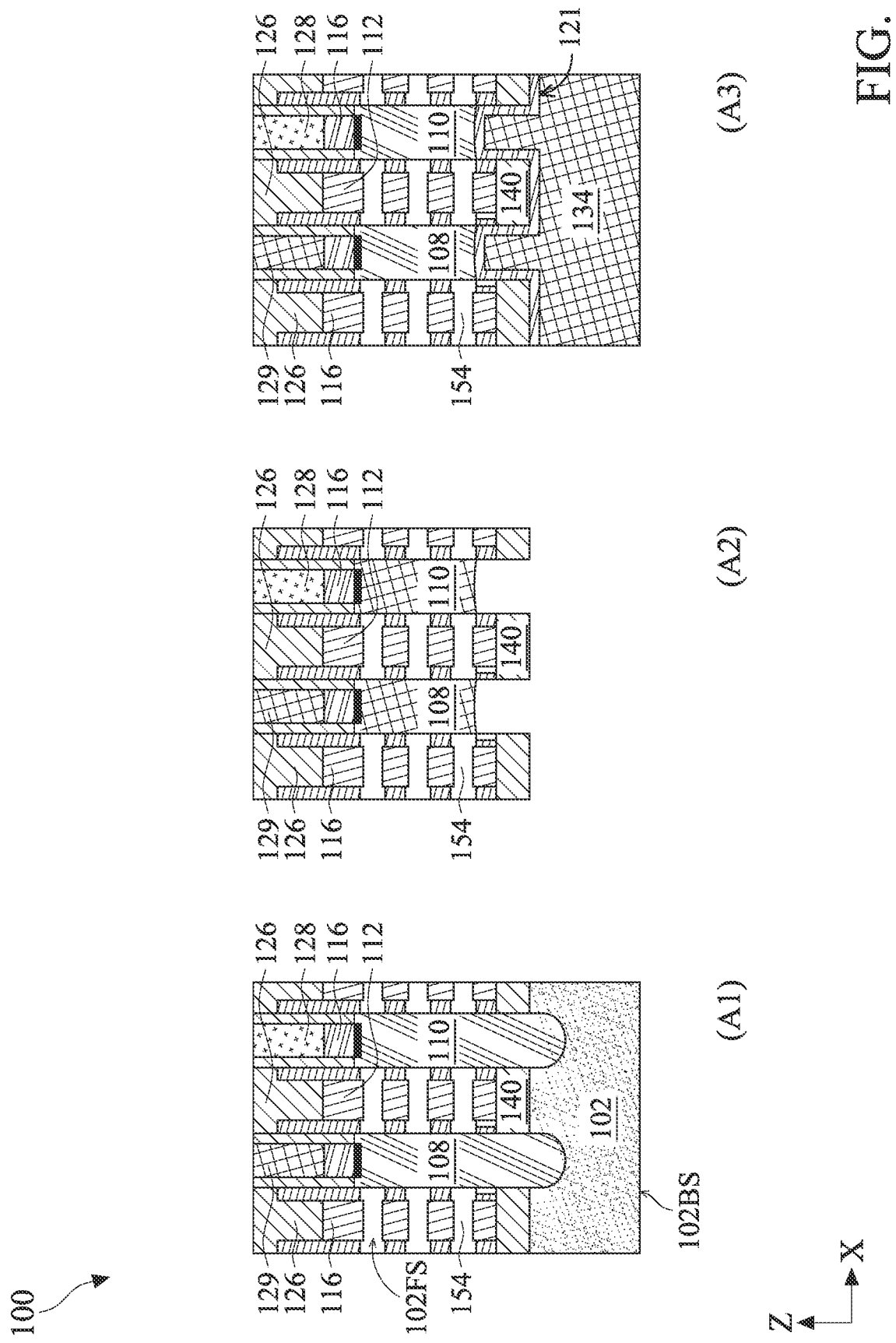
FIG. 5 illustrates sectional views of the semiconductor structure of FIG. 1 at various stages constructed according to some embodiments.
Figure 5:
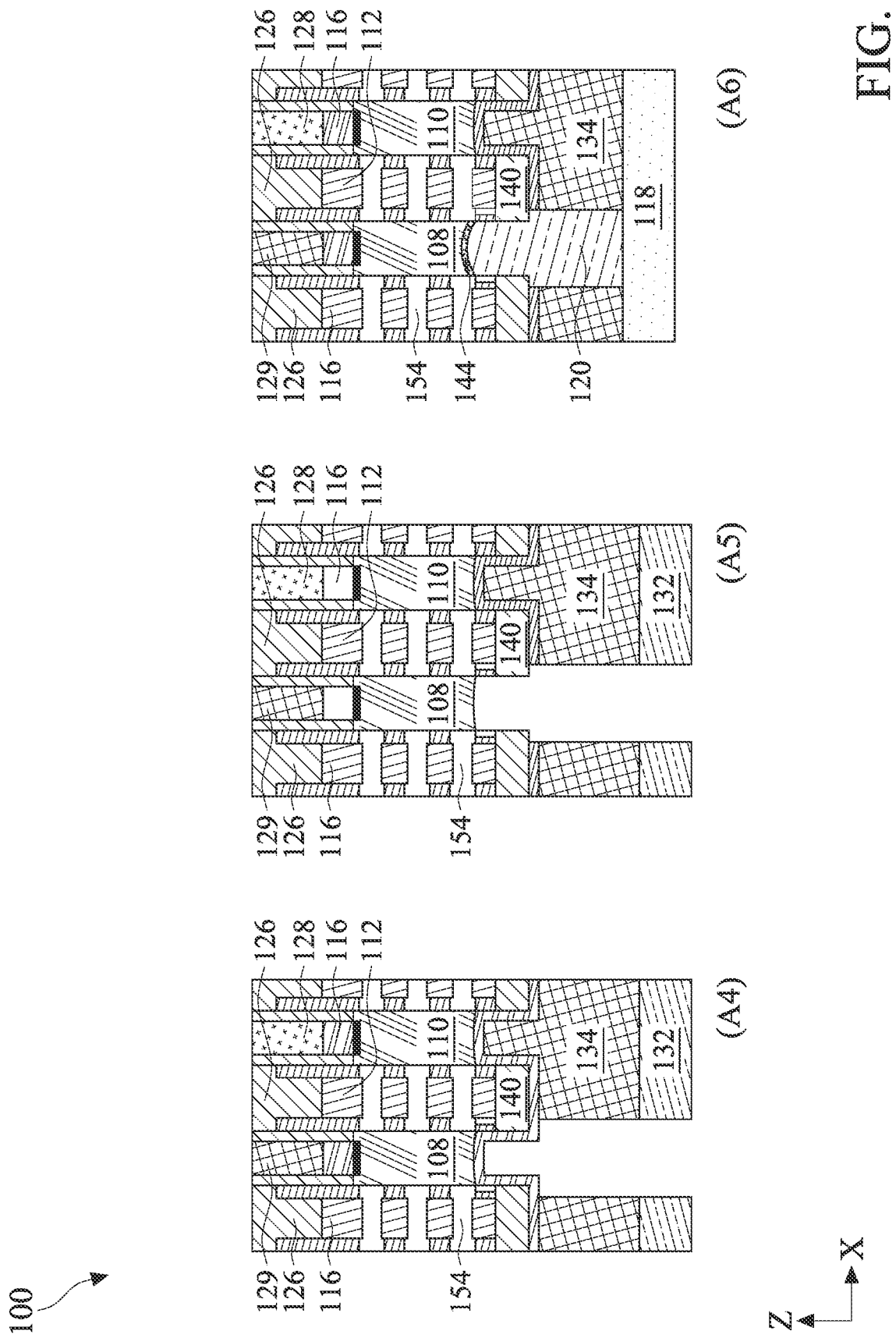
Figure 5:
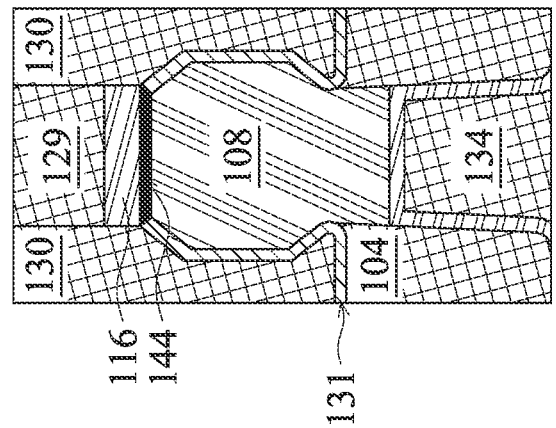
Figure 5:
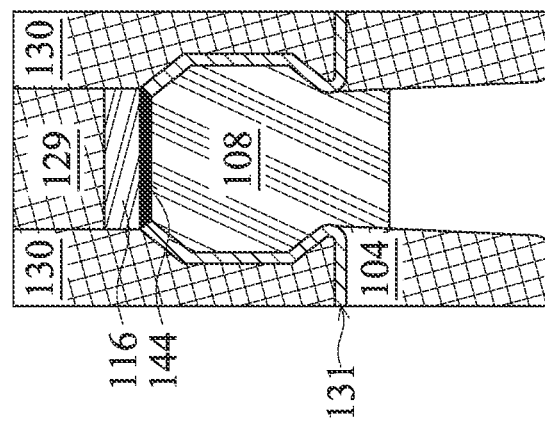
Figure 5:
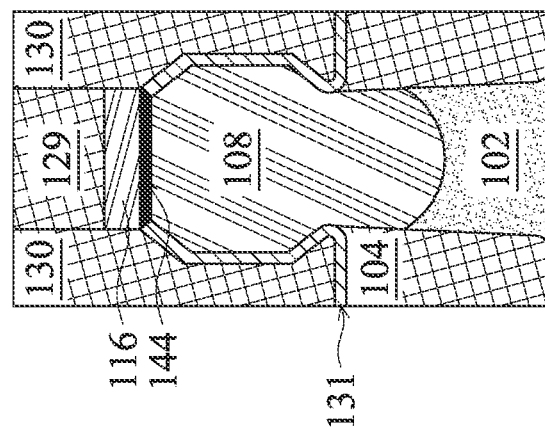
Figure 5:
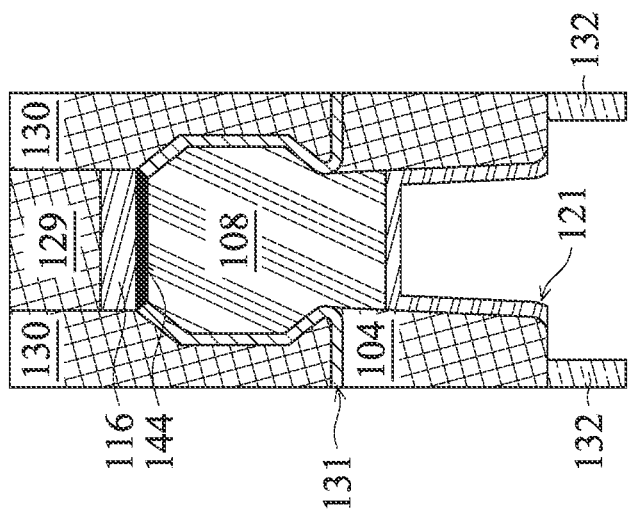
Figure 5:
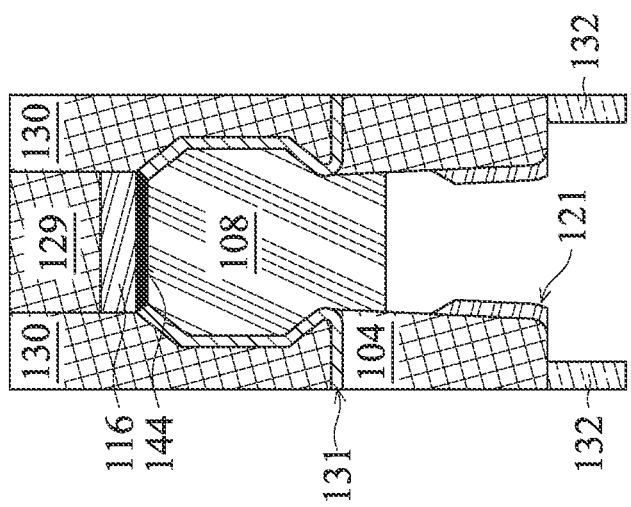
Figure 5:
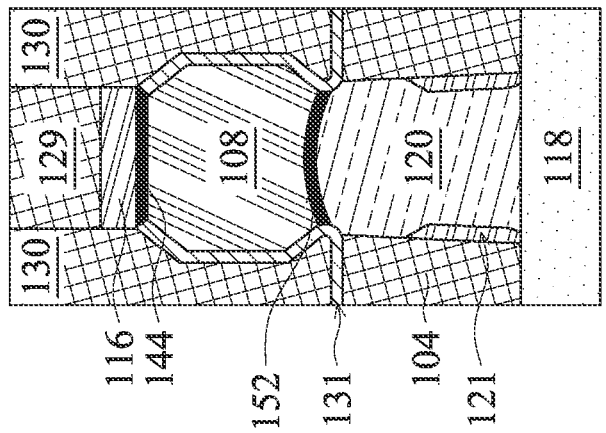
Figure 5:
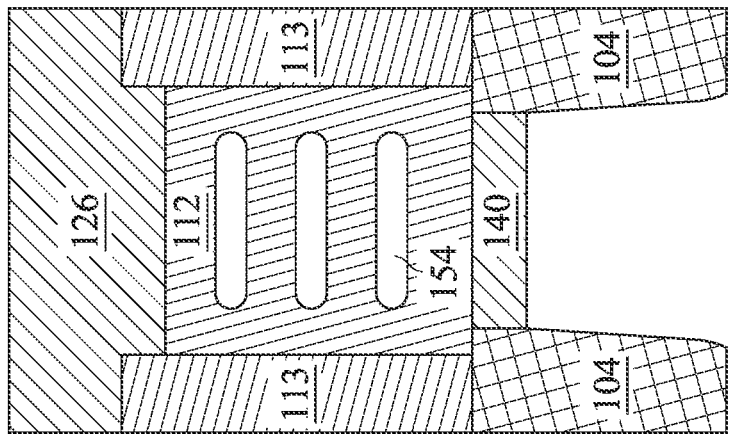
Figure 5:
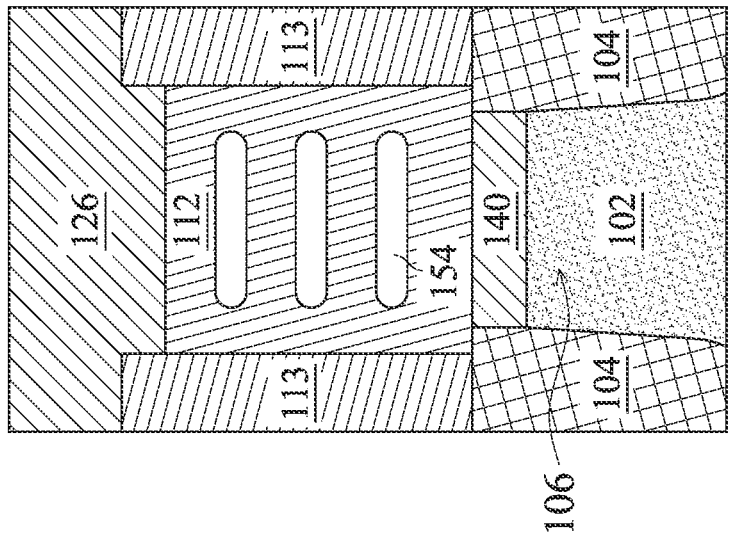
Figure 5:
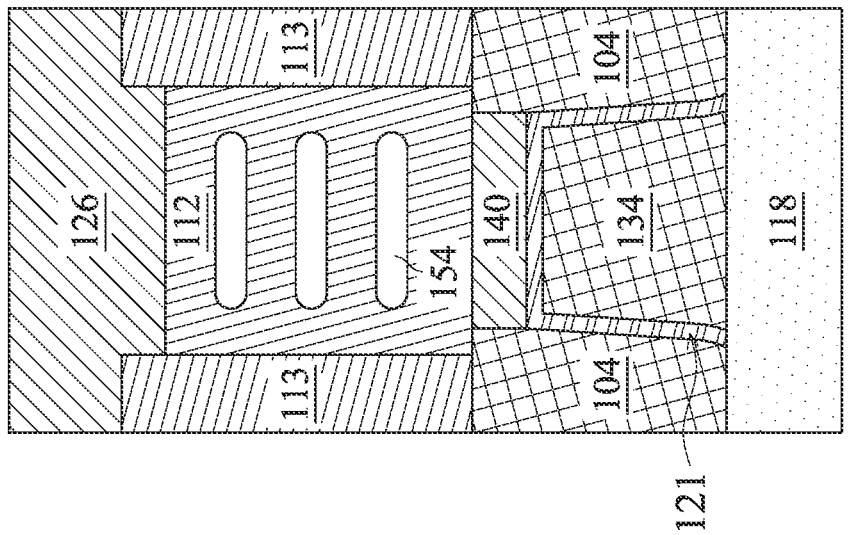
Figure 5:
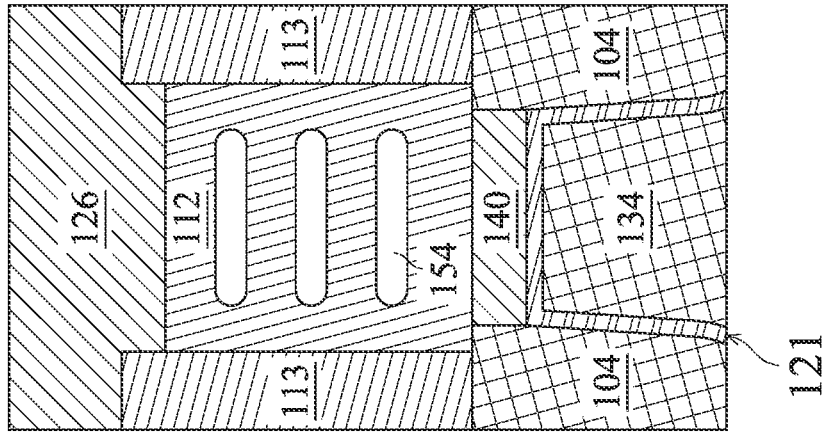
Figure 7:
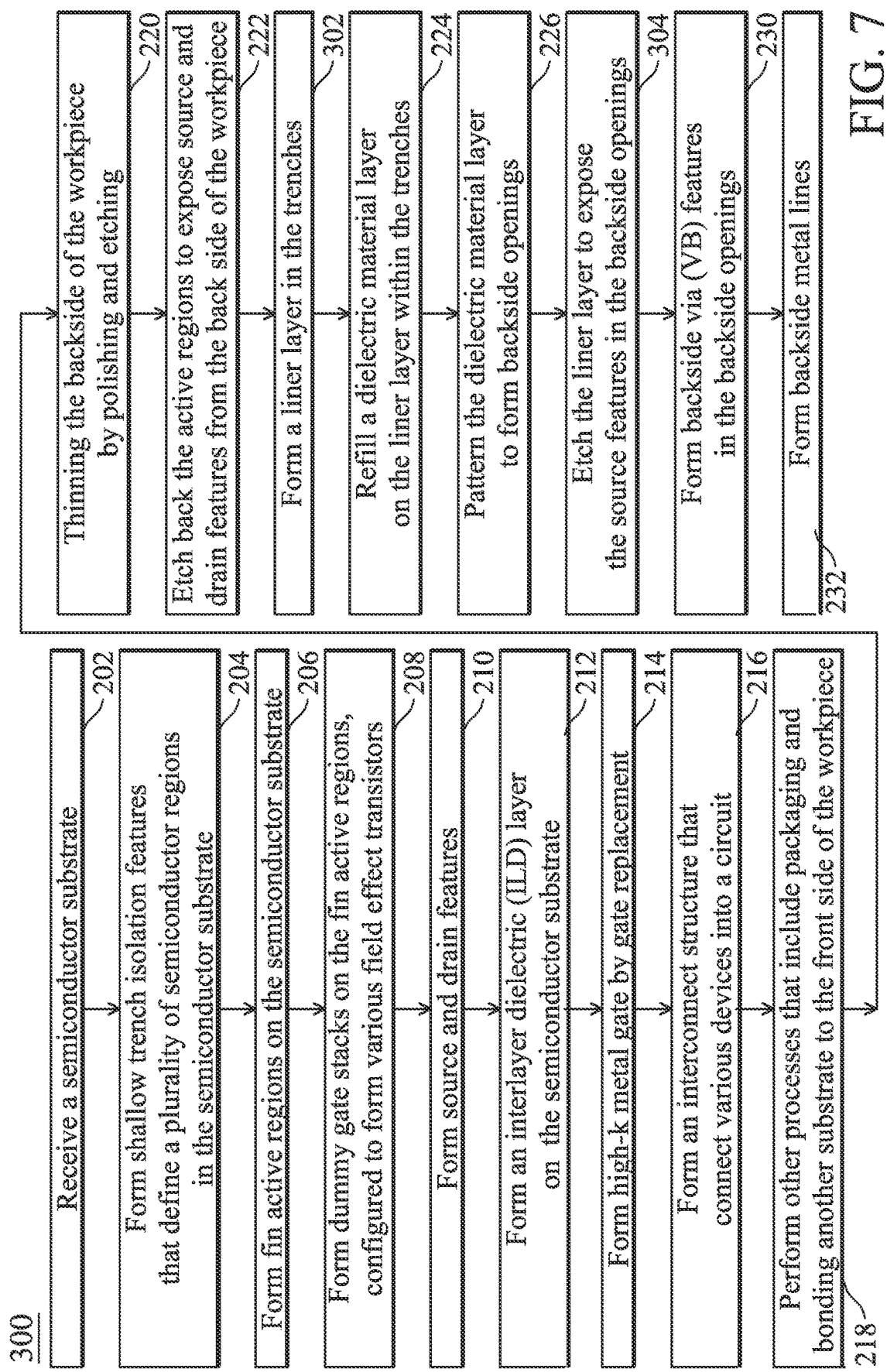
FIG. 7 is a flowchart of a method making the semiconductor structure of FIGS. 1, 5 and 6 constructed according to some embodiments.

FIG. 5 illustrates sectional views of the semiconductor structure 100 constructed according to some embodiments. Especially, A1~A6; B1~B6; and C1~C4 in FIG. 5 are sectional views of the semiconductor structure 100 along the dashed lines AA', BB', and CC' of FIG. 1, respectively. FIG. 7 is a flowchart of a method 300 of making the semiconductor structure 100 constructed in accordance with some embodiments. The method 300 and the semiconductor structure 100 fabricated by the method 300 are collectively described below. The semiconductor structure 100 of FIG. 5 is similar to the semiconductor structure 100 of FIG. 2. Those similar features are not repeated for simplicity.

The method 300 begins with a block 202 by receiving a substrate 102. The substrate 102 includes a plurality of Si films and SiGe films alternatively stacked, which may be formed by epitaxial growth.

The method 300 includes some operations (such as 204-218) applied on the front side of the workpiece and some operations (such as 220-222, 302, 224-226, 304 and 230-232) applied to the back side of the workpiece. Those operations are described with reference to FIGS. 1, 5 and 7. Particularly, the method 300 includes following operations on the front side of the workpiece: an operation 204 to form STI features 104 on the substrate 102; an operation 206 to form active regions 106; an operation 208 to form dummy gate stacks on the active regions; an operation 210 to form source features 108 and drain features 110; an operation 212 to form an ILD layer 130; an operation 214 to form gate stacks 112 with gate dielectric of high-k dielectric material and gate electrode of metal; and an operation 216 to form an interconnect structure that includes contact features, via features and metal lines. The method 300 may include other operations 218 applied to the front side of the workpiece, such as packaging and bonding another substrate to the front side of the workpiece. The method 300 proceeds to various operations on the back side of the workpiece.

The method 300 includes an operation 220 to thin down the workpiece from the backside; an operation 222 to selectively etch back the semiconductor material (silicon in the present embodiment) of the fin active regions 106, resulting in trenches such that the source features 108 and drain features 110 are exposed within the trenches from the back side. As illustrated in A2 of FIG. 5, the lowest inner spacers 156 are also exposed.

The method 300 includes an operation 302 to form a liner layer 121 in the trenches, as illustrated in A3, B3 and C3 of FIG. 5. The liner layer 121 formed in the operation 302 includes a dielectric material different from those of the inner spacers 156 and the STI features 104 to provide etch selectivity. For example, the liner layer 121 includes silicon nitride, silicon oxynitride, other suitable dielectric material or a combination thereof. The liner layer 121 is formed by a suitable deposition process, such as CVD, ALD, other suitable deposition or a combination thereof. The liner layer 121 is formed on bottom surfaces of both source features 108 and drain features 110.

The method 300 proceeds to an operation 224 to refill a dielectric material layer 134 on the liner layer 121 within the trenches, as illustrated in A3, B3 and C3 of FIG. 5. The operation 224 may include a suitable deposition, such as FCVD process, or a suitable deposition followed by CMP. The dielectric material layer 134 may be different from or alternatively same to that of the STI features 104 and may include a dielectric material, such as silicon oxide, silicon nitride or a combination thereof.

The method 300 proceeds to an operation 226 to pattern the dielectric material layer 134 to form backside openings 142 aligned with a subset of the source and drain features, as illustrated in A4 and B4 of FIG. 5. The operation 226 includes forming a patterned photoresist layer 132 by a lithography process and an etching process. In the present embodiment, the source features 108 are aligned with the backside openings 142 while the drain features 110 remain covered by the dielectric material layer 134. In the backside openings 142, the liner layer 121 disposed on the source features 108 are exposed with within the backside openings 142. Since the liner layer 121 is different from the STI features 104 in composition, the liner layer 121 can function as an etch stop layer during the etching process.

The method 300 proceeds to an operation 304 to open the liner layer 121 such that the source features 108 are exposed within the backside openings 142, as illustrated in A5 and B5 of FIG. 5. The operation 304 includes an anisotropic etching process, such as plasma etching, to break through the liner layer 121.

The method 300 proceeds to an operation 230 to form VB features 120 landing on the source features 108. The operation 230 may include deposition and CMP. The method 300 proceeds to an operation 232 to form backside metal lines 118 landing on the VB features 120. The backside metal lines 118 electrically connected to the source features 108 through the VB features 120. The backside metal lines 118 may be configured to function as backside power rails to provide electrical bias to the source features 108. The method 300 may further include other operations, such as fabricating bonding pads on the backside of the workpiece such that all metal lines (both on the front side and the back side) are routed to the backside bonding pads for assembling the corresponding chips on the circuit boards or circuit modules.

Figure 6:
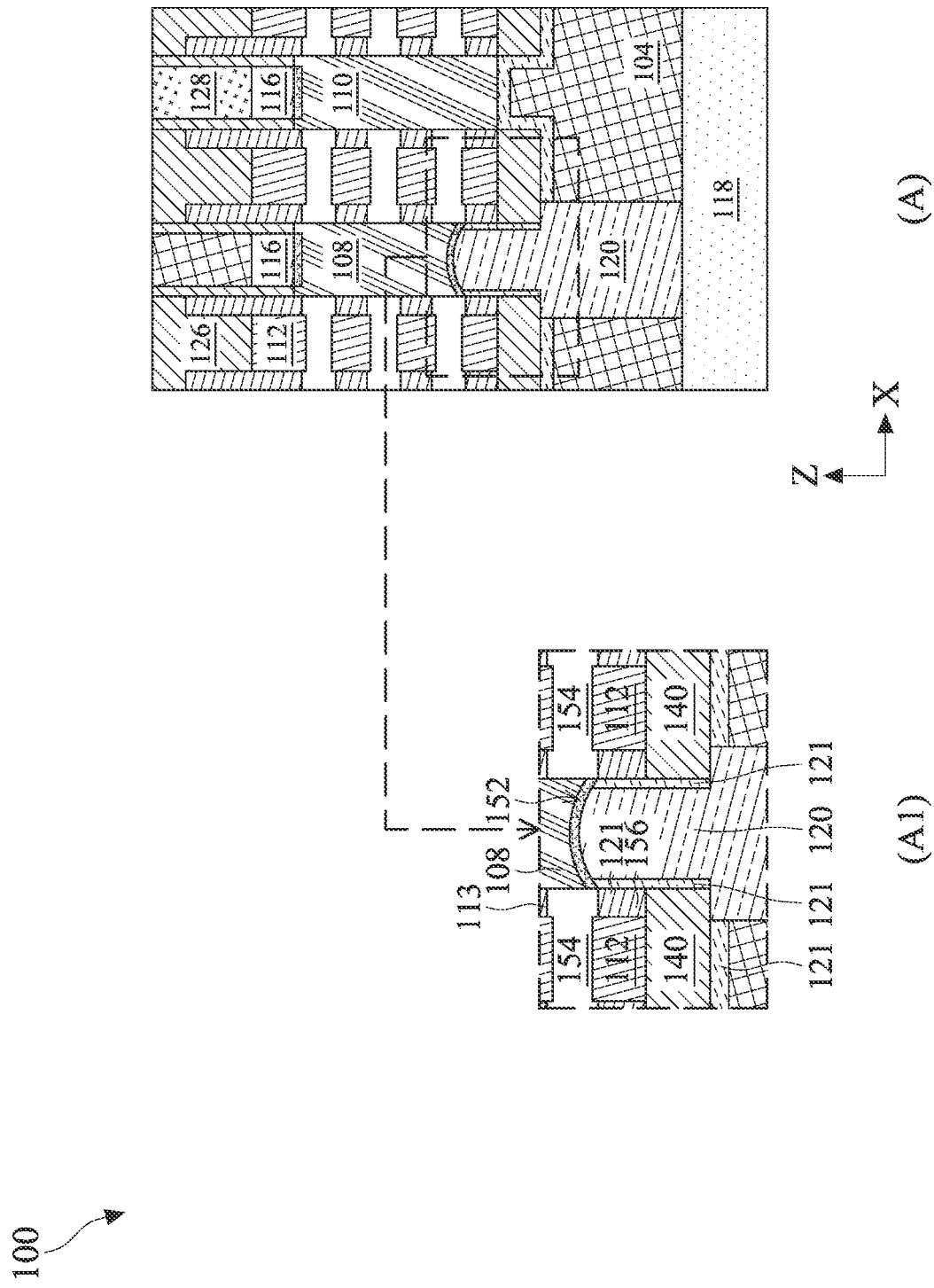
FIG. 6 illustrates sectional views of the semiconductor structure of FIGS. 1 and 5 constructed according to some embodiments.
Figure 6:
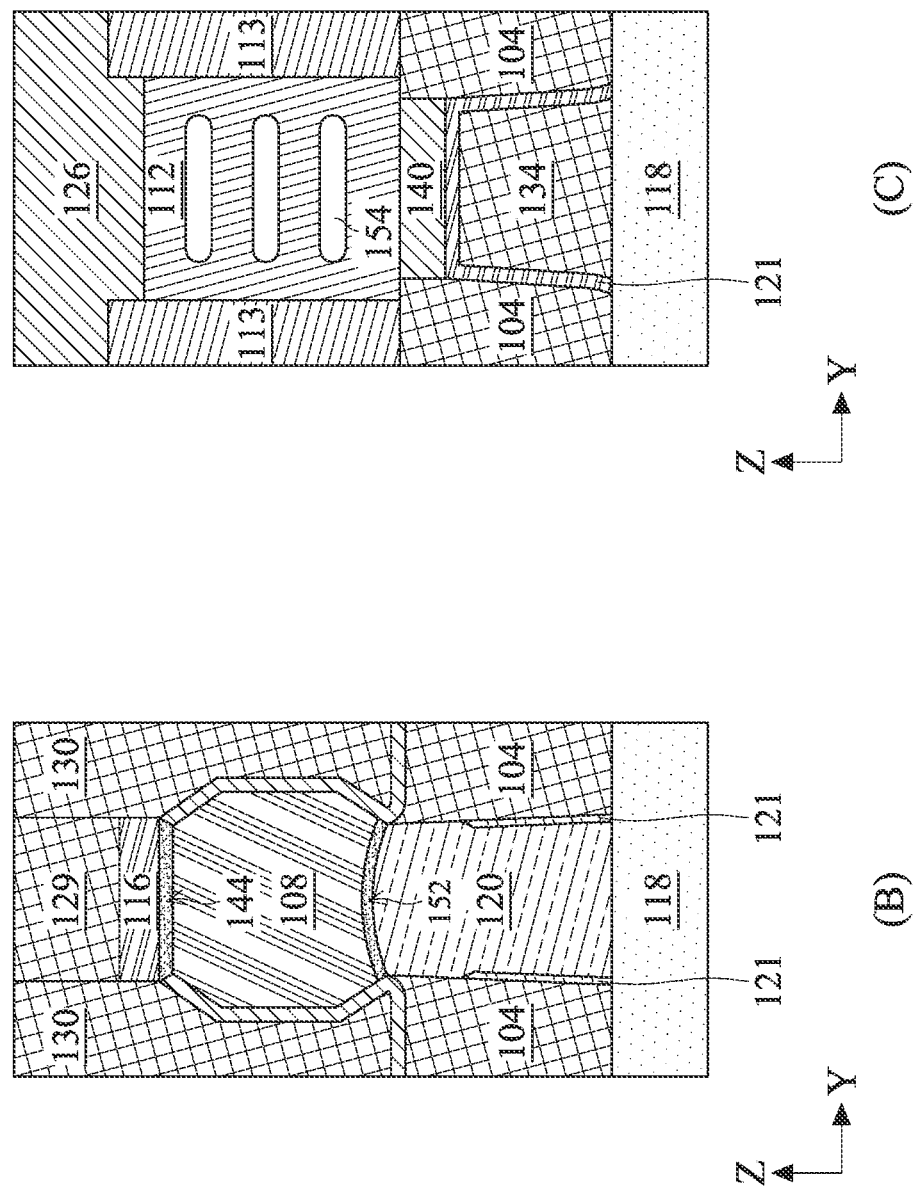

The semiconductor structure 100 is further illustrated with various sectional views (A), (B) and (C) in FIG. 6, the portion of the semiconductor structure 100 in (A) of FIG. 6 is further enlarged and illustrated in (A1). In the described structure, the liner layer 121 is disposed on sidewalls of the backside via feature 120. The liner layer 121 directly contacts both the backside via feature 120 and the STI feature 104. However, the liner layer 121 is different from the STI feature 104 in composition to achieve etch selectivity. Furthermore, the liner layer 121 is extending from the sidewalls of the bottom SAC layer 140 to the sidewalls of lower inner spacers 156, as illustrated in (A) and (A1) of FIG. 6. Furthermore, the liner layer 121 is also formed on the bottom surface of the bottom SAC layer 140. Thus, the liner layer 121 can effectively protect the inner spacers 156 and the STI feature 104 from damaging during subsequent cleaning process, such as pre-silicide cleaning and pre-VB cleaning. It is noted that the liner layer 121 are present at both source feature 108 and the drain feature 110 with respective configurations, which is different from that of the liner layer 121 in FIG. 3. Especially, the liner layer 121 includes a portion extending to a bottom surface of the drain feature and separating the drain feature 110 from the dielectric material layer 134. As to the source feature 108, the liner layer 121 is disposed on sidewalls of the VB feature 120 but is distanced away from the source feature 108. As illustrated in (B) of FIG. 6, the liner layer 121 is distanced away from the etch stop layer 131 at the source feature. The thickness of the liner layer 121 is not uniform and gradually reduces to zero when extending up to the source feature 108. As illustrated in (C) of FIG. 6, the liner layer 121 is also extending to the gate stack 112 and directly contacts the bottom SAC layer 140 underlying the gate stack 112. Especially, the thickness Tg of the liner layer 121 in (C) of FIG. 6 is thicker than the thickness Ts of the liner layer 121 in (B) of FIG. 6 because the anisotropic etching process to expose the source features 108 is not applied to the portion of the liner layer 121 in (C) of FIG. 6. The thickness ratio Ts/Tg may range between 0.8 and 0.9.

Figure 8:
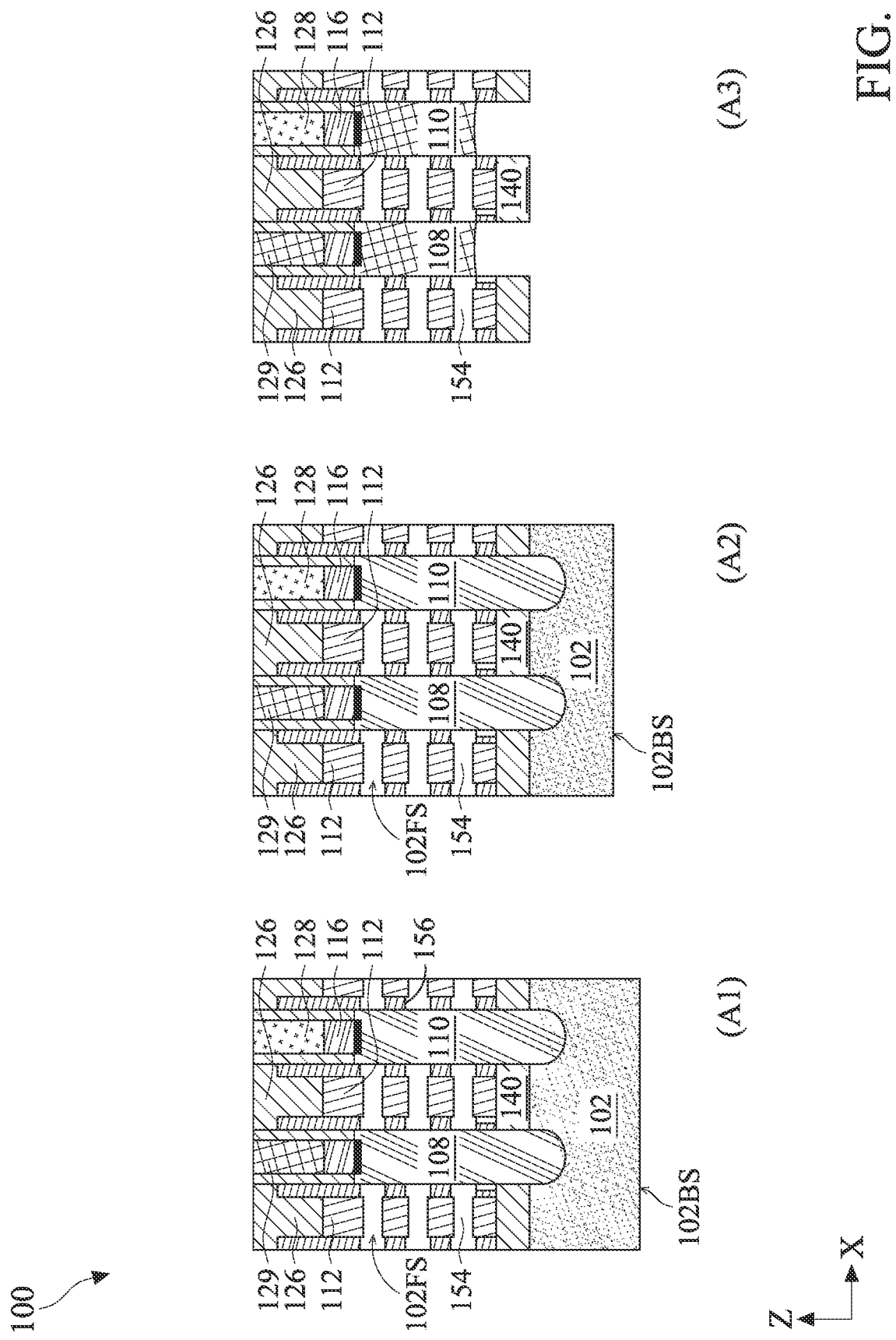
FIG. 8 illustrates sectional views of the semiconductor structure of FIG. 1 at various stages constructed according to some embodiments.
Figure 8:
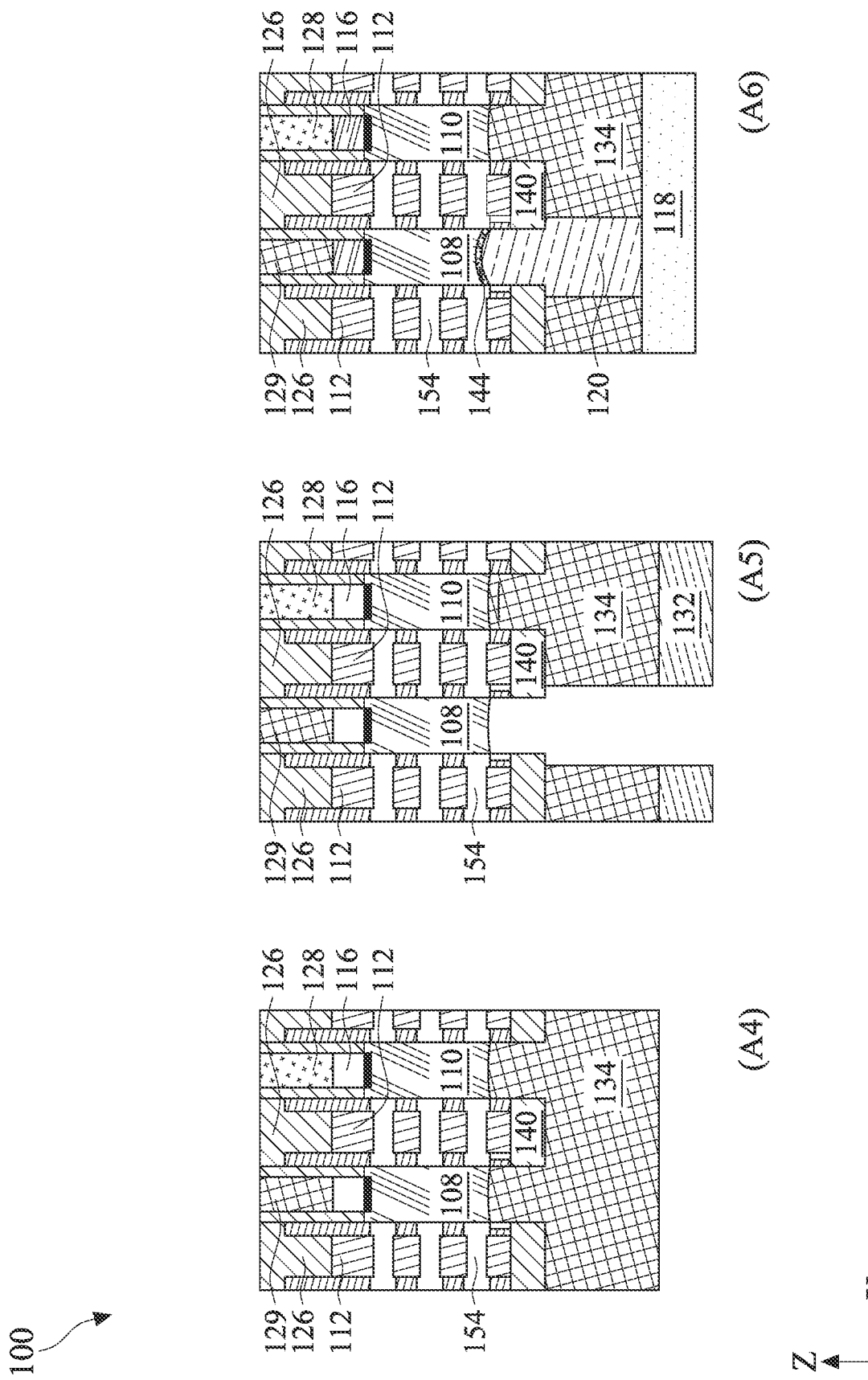
Figure 8:
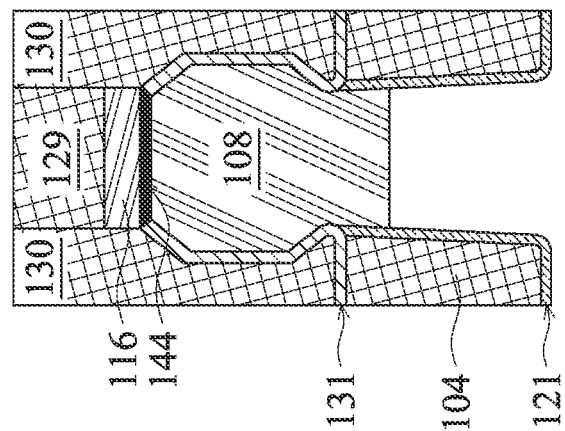
Figure 8:
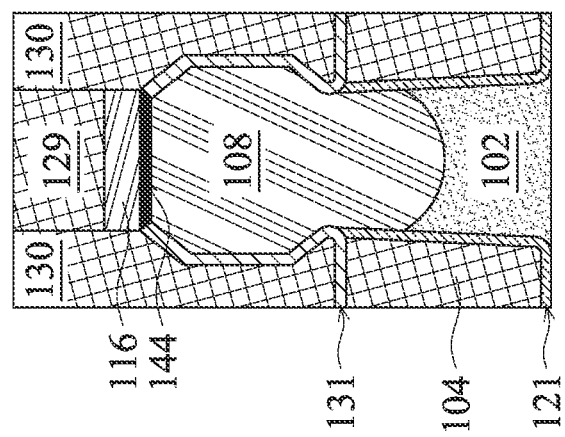
Figure 8:
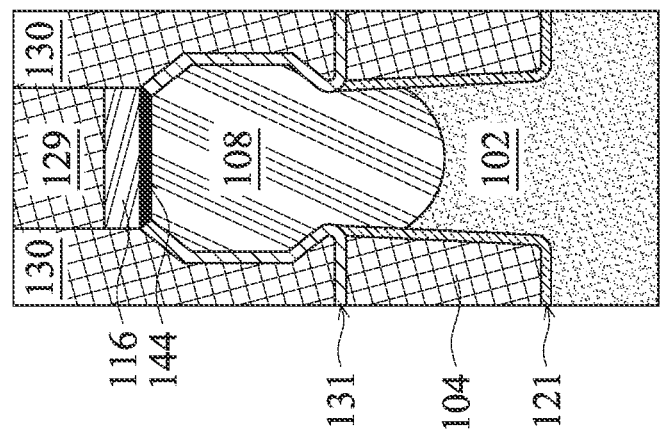
Figure 8:
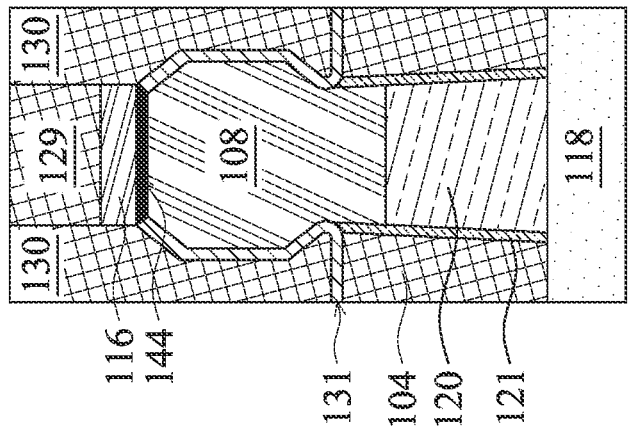
Figure 8:
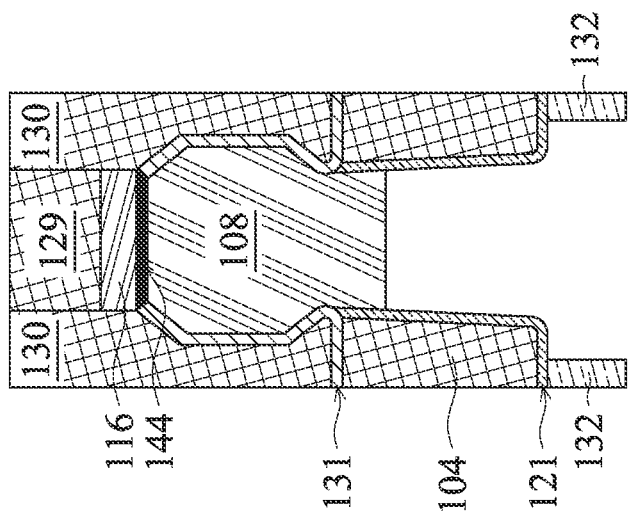
Figure 8:
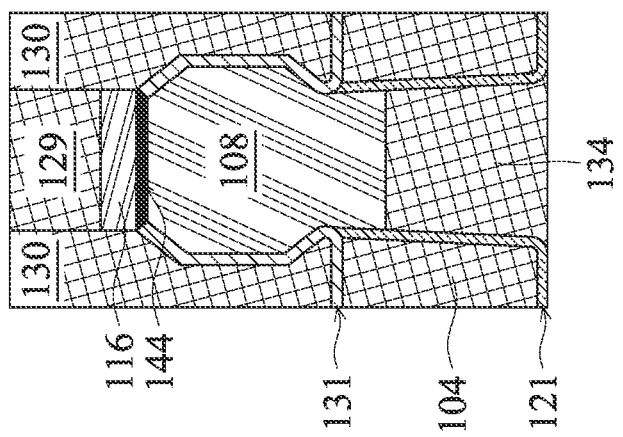
Figure 8:
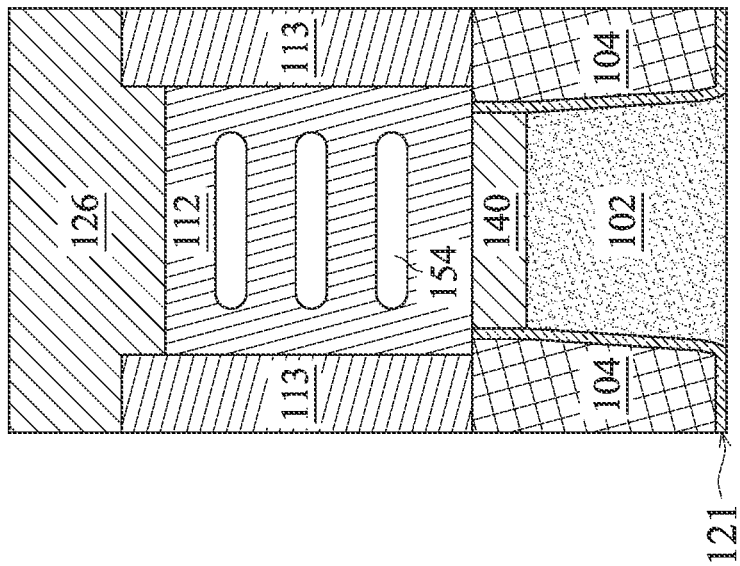
Figure 8:
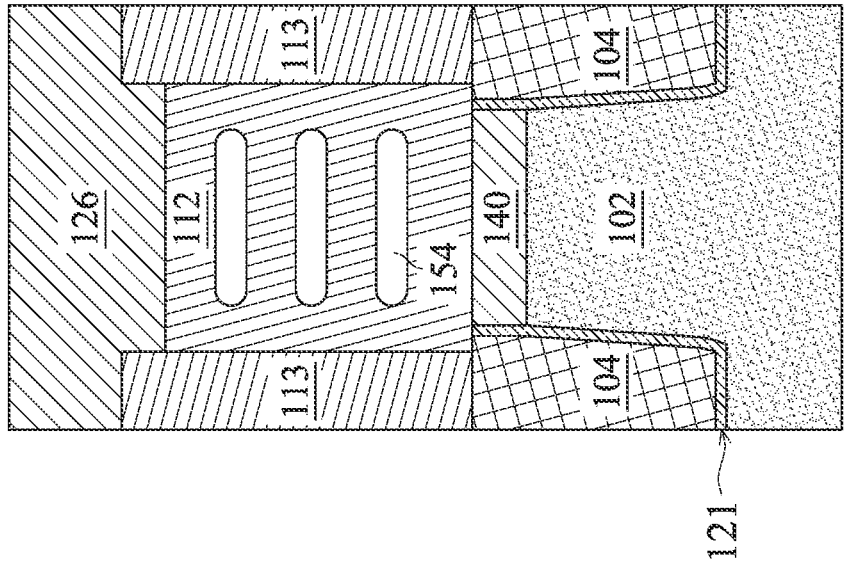
Figure 8:
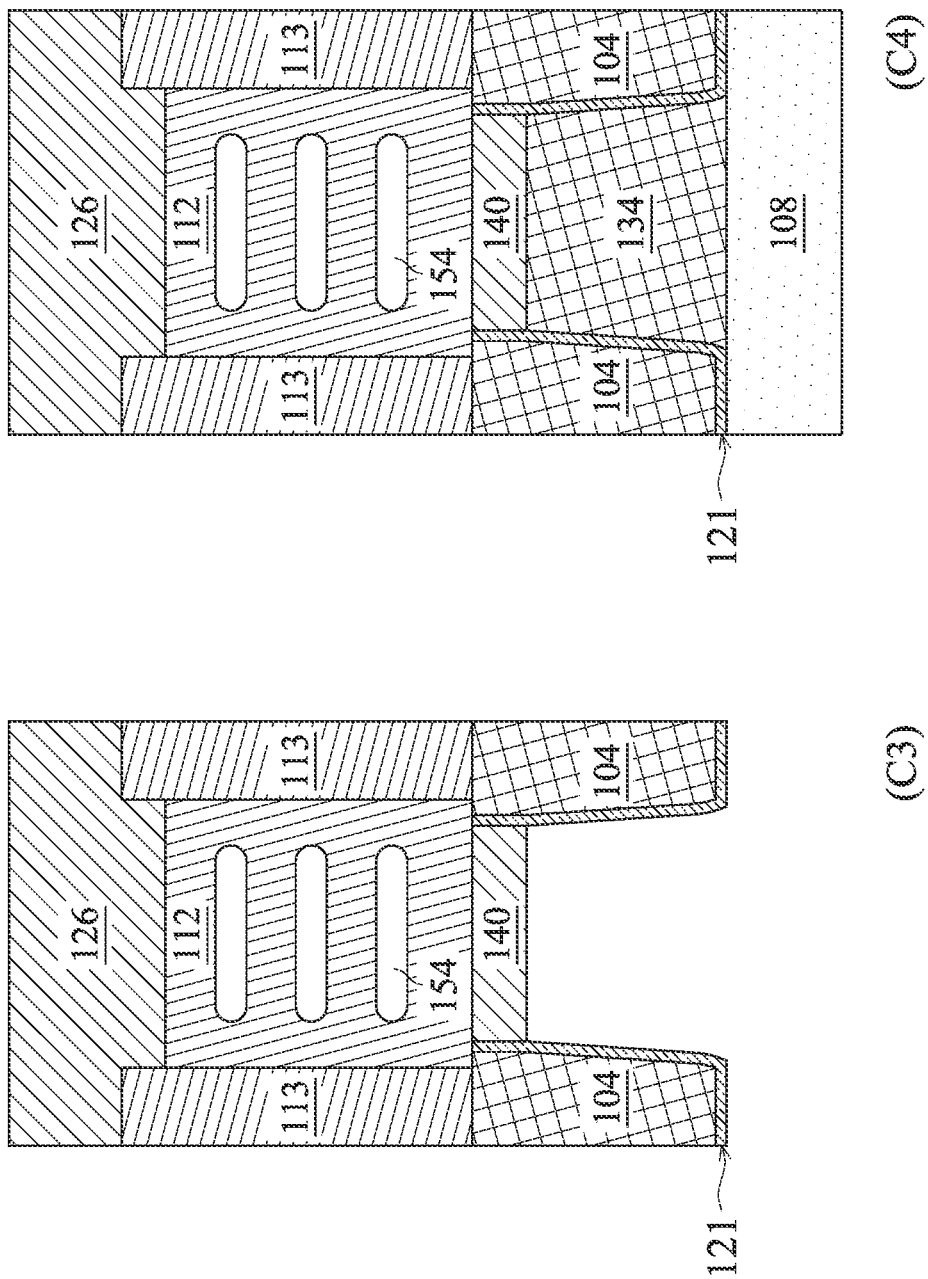
Figure 10:
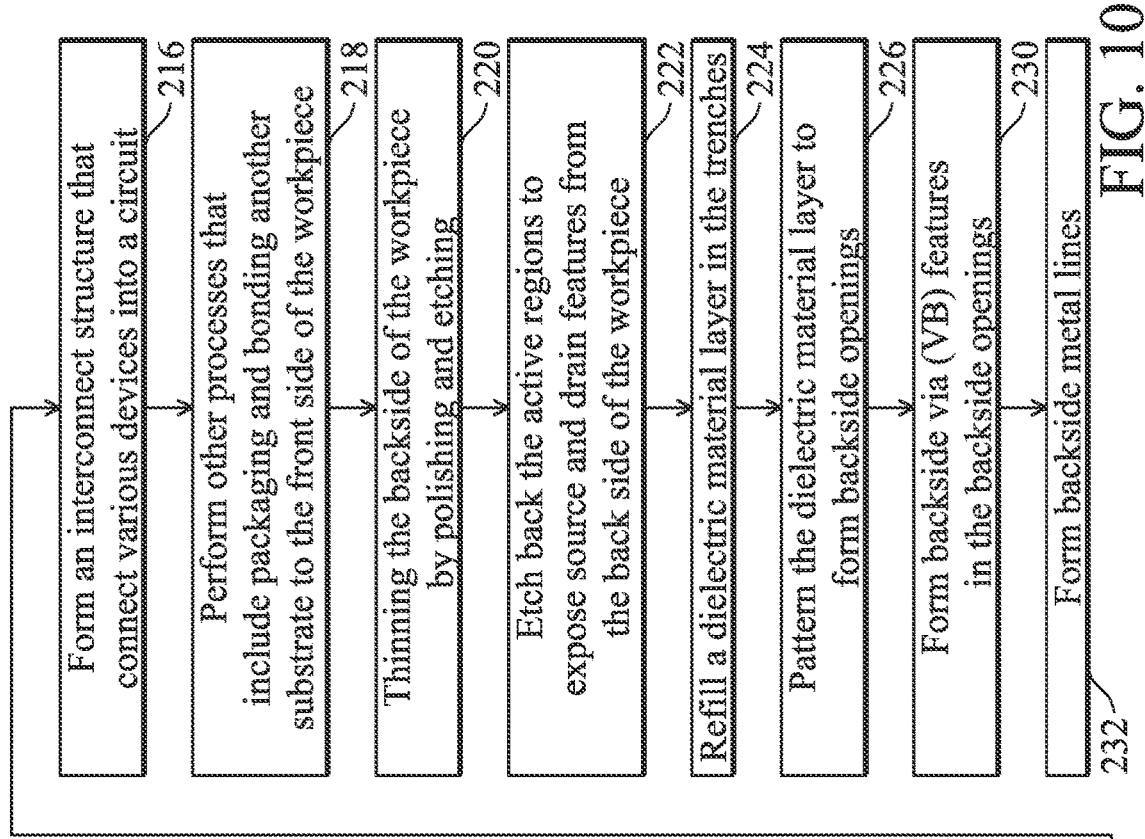
FIG. 10 is a flowchart of a method making the semiconductor structure of FIGS. 1, 8 and 9 constructed according to some embodiments.
Figure 10:
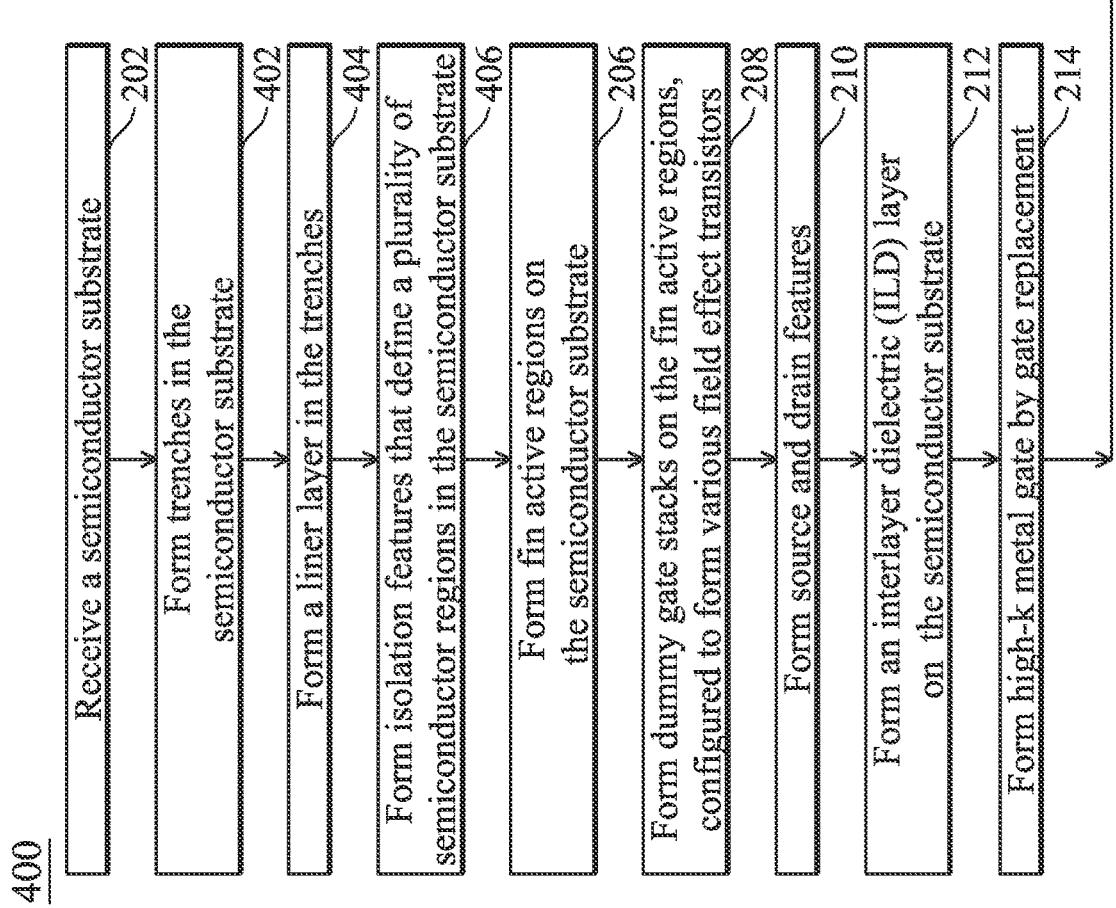

FIG. 8 illustrates sectional views of the semiconductor structure 100 constructed according to some embodiments. Especially, A1~A6; B1~B6; and C1~C4 in FIG. 8 are sectional views of the semiconductor structure 100 along the dashed lines AA', BB', and CC' of FIG. 1, respectively. FIG. 10 is a flowchart of a method 400 of making the semiconductor structure 100 constructed in accordance with some embodiments. The method 400 and the semiconductor structure 100 fabricated by the method 400 are collectively described below. The semiconductor structure 100 of FIG. 8 is similar to the semiconductor structure 100 of FIG. 2 or FIG. 5. Those similar features are not repeated for simplicity.

The method 400 begins with a block 202 by receiving a substrate 102. The substrate 102 includes a plurality of Si films and SiGe films alternatively stacked, which may be formed by epitaxial growth. The method 400 includes some operations (such as 402, 404, 406 and 206-218) applied on the front side of the workpiece and some operations (such as 220-226 and 230-232) applied to the back side of the workpiece. Those operations are described with reference to FIGS. 1, 8 and 10. Particularly, the liner layer 121 is formed by operations 402 and 404 during the processes applied to the front side of the workpiece.

The method 400 includes an operation 402 to form shallow trenches in the substrate 102 by lithography process and etching. Then the method 400 proceeds to an operation 404 to form a liner layer 121 in the shallow trenches by a suitable deposition, such as CVD or ALD such that the liner layer 121 is conformally deposited on the shallow trenches according to some embodiments. Thereafter, the method 400 proceeds to an operation 406 to form isolation features (or STI features) 104 on the liner layer within the shallow trenches. The STI features 104 are formed by deposition and CMP. The liner layer 121 and the STI features 104 are different in composition to provide etch selectivity. Furthermore, the liner layer 121 is additionally different in composition from the inner spacers 156 to be formed at later stage, providing etch selectivity and protection to the inner spacer 156. In some embodiments, the liner layer 121 includes a suitable dielectric material, such as silicon nitride or silicon oxynitride or a combination thereof while the STI features 104 and the inner spacers 156 include different dielectric material, such as silicon oxide.

The method 400 includes following operations on the front side of the workpiece: an operation 206 to form active regions 106; an operation 208 to form dummy gate stacks on the active regions; an operation 210 to form source features 108 and drain features 110; an operation 212 to form an ILD layer 130; an operation 214 to form gate stacks 112 with gate dielectric of high-k dielectric material and gate electrode of metal; and an operation 216 to form an interconnect structure that includes contact features, via features and metal lines. The method 400 may include other operations 218 applied to the front side of the workpiece, such as packaging and bonding another substrate to the front side of the workpiece. The method 400 proceeds to various operations on the back side of the workpiece.

The method 400 includes an operation 220 to thin down the workpiece from the backside; an operation 222 to selectively etch back the semiconductor material (silicon in the present embodiment) of the fin active regions 106, resulting in trenches such that the source features 108 and drain features 110 are exposed within the trenches from the back side. As illustrated in B3 of FIG. 8, the liner layer 121 is exposed in the trenches.

The method 400 includes an operation 224 to refill a dielectric material layer 134 on the liner layer 121 within the trenches, as illustrated in A4 and B4 of FIG. 8. The operation 224 may include a suitable deposition, such as FCVD process, or a deposition followed by CMP. The dielectric material layer 134 is different from that of the liner layer 121 and may include silicon oxide.

The method 400 proceeds to an operation 226 to pattern the dielectric material layer 134 to form backside openings 142 aligned with a subset of the source and drain features, as illustrated in A5 and B5 of FIG. 8. The operation 226 includes forming a patterned photoresist layer 132 by a lithography process and removing the dielectric material layer 134 within the openings of the patterned photoresist layer 132 by an etching process. In the present embodiment, the source features 108 are aligned with the backside openings 142 while the drain features 110 remain covered by the dielectric material layer 134. Since the liner layer 121 is different from the STI features 104 in composition, the liner layer 121 can function as an etch stop layer during the etching process.

The method 400 proceeds to an operation 230 to form VB features 120 landing on the source features 108. The operation 230 may include deposition and CMP. The method 400 proceeds to an operation 232 to form backside metal lines 118 landing on the VB features 120. The backside metal lines 118 electrically connected to the source features 108 through the VB features 120. The backside metal lines 118 may be configured to function as backside power rails to provide electrical bias to the source features 108. The method 400 may further include other operations, such as fabricating bonding pads on the backside of the workpiece such that all metal lines (both on the front side and the back side) are routed to the backside bonding pads for assembling the corresponding chips on the circuit boards or circuit modules.

Figure 9:
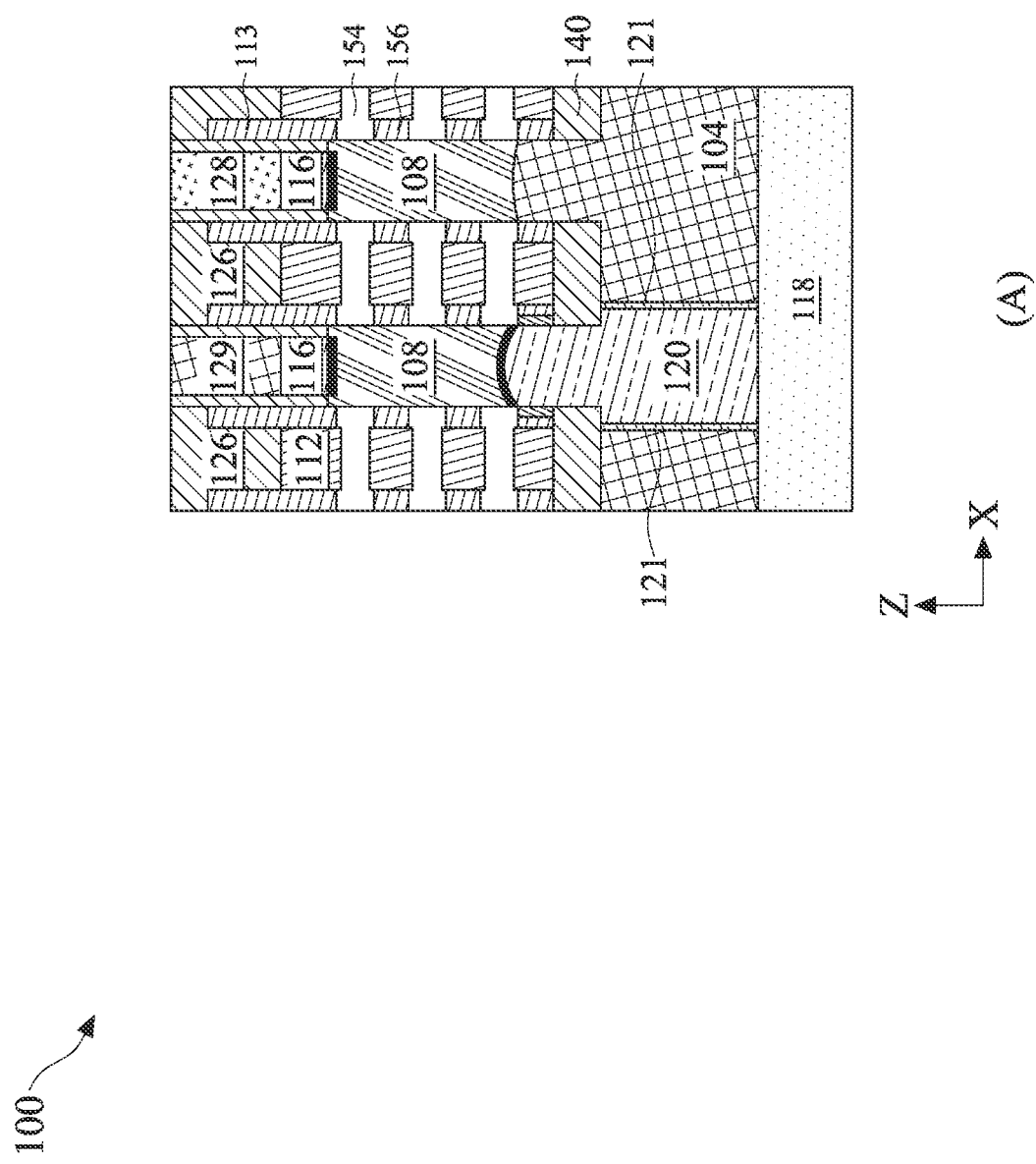
FIG. 9 illustrates sectional views of the semiconductor structure of FIGS. 1 and 8 constructed according to some embodiments.
Figure 9:
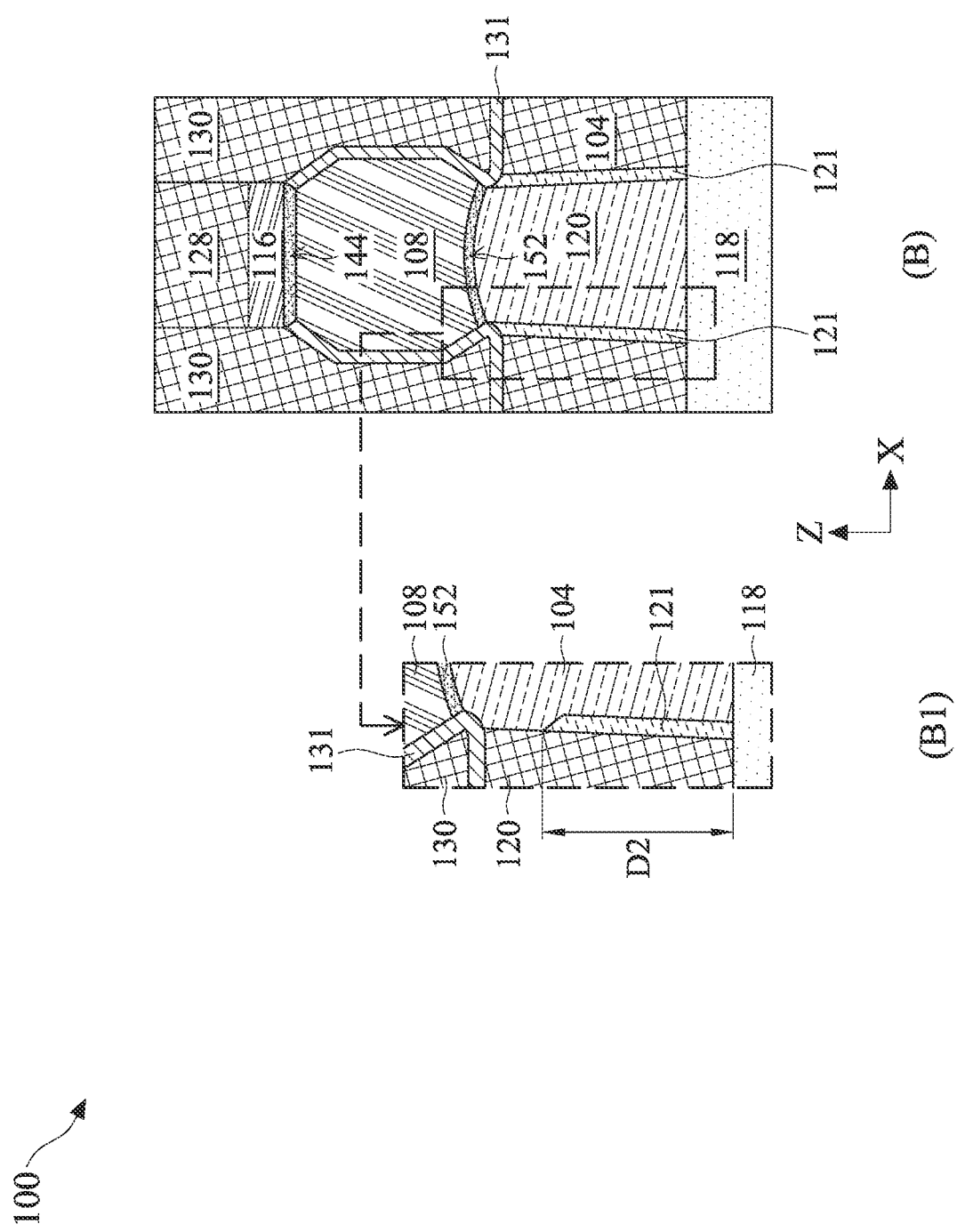
Figure 9:
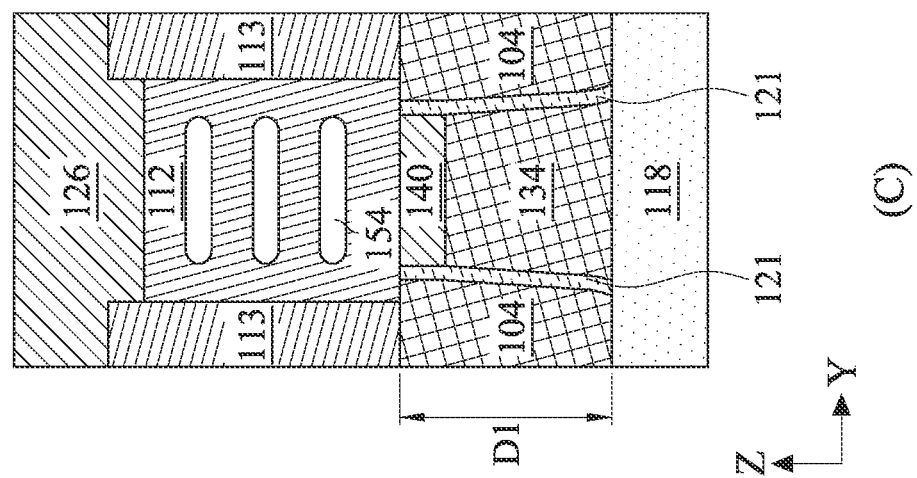

The semiconductor structure 100 is further illustrated with various sectional views (A), (B) and (C) in FIG. 9, the portion of the semiconductor structure 100 in (A) of FIG. 9 is further enlarged and illustrated in (A1) of FIG. 9. In the described structure, the liner layer 121 is formed during the front side processes. The liner layer 121 is disposed on sidewalls of the backside via feature 120 and is further extending to the common edges of the etch stop layer 131 and the silicide layer 152. The liner layer 121 directly contacts both the backside via feature 120 and the STI feature 104. However, the liner layer 121 is different from the STI feature 104 in composition to achieve etch selectivity. Furthermore, the liner layer 121 is extending between the STI feature 104 and the BSAC 140 as illustrated in (C) of FIG. 9, which is different from either one of FIG. 3 and FIG. 6. The liner layer 121 extends from the bottom surface of the gate stack 112 to the backside metal line 118 with a height D1 as illustrated in (C) of FIG. 9. In some embodiments, the liner layer 121 may be reduced to a height D2 (as illustrated in (B1) of FIG. 9) during the etching process to recess the S/D regions in the operation 210. D2 is less than D1. In some other embodiments, D2 may be equal to or less than D1, depending process tuning.

The semiconductor structure 100 and the method making the same may have other alternative, extension or modification. For examples, the source feature 108 may be alternatively connected to the front metal line through front contact feature while the drain feature 110 is connected to the backside metal line 118 through the VB feature 120. In some examples, the liner layer 121 may be formed with other suitable dielectric material, such as silicon nitride, silicon carbon nitride, SiOCN, silicon oxide, SiOC, metal oxide, silicon metal oxide, metal nitride, metal oxynitride or a combination thereof.

The present disclosure provides a semiconductor structure 100 having the VB feature 120 and the liner layer 121 surrounding the VB feature 120. The semiconductor structure 100 further includes the backside metal line 118 electrically connected to the source feature 108 through the VB features 120. The present disclosure provides various embodiments of the VB feature 120 and the liner layer 121 and the method making the same. The liner layer 121 is designed and formed to effectively protect the inner spacers 156 and the STI feature 104 from damaging during subsequent cleaning process, such as pre-silicide cleaning and pre-VB cleaning.

The disclosed structure reduces routing resistance, enlarges alignment margins, increases layout flexibility, and enhances packing density. The disclosed structure provides more flexibility to circuit design layout and greater process window of integrated circuit (IC) fabrication, making the disclosed structure suitable for advanced technology nodes. The disclosed structure can be used in various applications where FinFETs are incorporated for enhanced performance. For example, the FinFETs with multi-fin devices can be used to form static random-access memory (SRAM) cells. In other examples, the disclosed structure can be incorporated in various integrated circuits, such as logic circuit, dynamic random-access memory (DRAM), flash memory, or imaging sensor.

In one aspect, the present disclosure provides a method of forming an integrated circuit structure. The method includes receiving a substrate having a front surface and a back surface; forming an isolation feature of a first dielectric material in the substrate, thereby defining an active region surrounded by the isolation feature; forming a gate stack on the active regions; forming a first and a second S/D feature on the fin active region; forming a front contact feature contacting the first S/D feature; thinning down the substrate from the back surface such that the isolation feature is exposed; selectively etching the active region, resulting in a trench surrounded by the isolation feature, the second S/D feature being exposed within the trench; forming, in the trench, a liner layer of a second dielectric material being different from the first dielectric material; forming a backside via feature landing on the second S/D feature within the trench; and forming a backside metal line landing on the backside via feature.

In another aspect, the present disclosure provides a method of forming an integrated circuit structure. The method includes receiving a substrate having a front surface and a back surface; forming a shallow trench in the substrate; depositing a first dielectric material in the shallow trench to form a liner layer; filling a second dielectric material on the liner layer to form an isolation feature in the shallow trench, thereby defining an active region surrounded by the isolation feature, wherein the second dielectric material is different from the first dielectric material; forming a gate stack on the active region; forming a first and a second source/drain (S/D) feature on the fin active regions, wherein the gate stack spans from the first S/D feature to the second S/D feature; forming an interconnect structure on the gate stack, the first and second S/D features from the front surface, wherein the interconnect structure includes a front contact feature contacting the first S/D feature; thinning down the substrate from the back surface such that the isolation feature is exposed; selectively etching the active region, resulting in a trench surrounded by the liner layer and the isolation feature, wherein the second S/D feature is exposed within the trench while the first S/D remains covered; and forming a backside via feature landing on the second S/D feature within the trench and surrounded by the liner layer.

In yet another embodiment, the present disclosure provides a semiconductor structure that includes a substrate having a front side and a back side; an active region extruded from the substrate and surrounded by an isolation feature; a gate stack formed on the front side of the substrate and disposed on the active region; a first and a second source/drain (S/D) feature formed on the active region and interposed by the gate stack; a front contact feature disposed on a top surface of the first S/D feature; a backside via feature disposed on and electrically connected to a bottom surface of the second S/D feature; and a liner layer disposed on sidewalls of the isolation feature and surrounding the backside via feature, wherein the liner layer includes a first dielectric material different from that of the isolation feature.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming an integrated circuit structure, comprising:
   receiving a substrate having a front surface and a back surface;
   forming an isolation feature of a first dielectric material in the substrate, thereby defining an active region surrounded by the isolation feature;
   forming a gate stack on the active region;
   forming a first and a second source/drain (S/D) feature on the active region, wherein the gate stack spans from the first S/D feature to the second S/D feature;
   forming an interconnect structure on the gate stack, the first and second S/D features from the front surface, wherein the interconnect structure includes a front contact feature contacting the first S/D feature;
   thinning down the substrate from the back surface such that the isolation feature is exposed;
   selectively etching the active region, resulting in a trench surrounded by the isolation feature, wherein the second S/D feature is exposed within the trench;
   forming, in the trench, a liner layer of a second dielectric material being different from the first dielectric material of the isolation feature;
   forming a backside via feature landing on the second S/D feature within the trench; and
   forming a backside metal line landing on the backside via feature.

2. The method of claim 1, wherein the forming of the liner layer includes performing a thermal treatment with nitrogen-containing gas.

3. The method of claim 2, wherein the performing of the thermal treatment includes applying at least one of $N_2$ and $NH_3$ gases at an elevated treatment temperature ranging between about 200° C. and 500° C.

4. The method of claim 3, wherein the performing of the thermal treatment includes applying a gas containing $O_2$, $N_2$ and $NH_3$ with a treatment pressure ranging between about 0.01 and 2 atm.

5. The method of claim 1, wherein the receiving of the substrate includes receiving the substrate having a plurality of silicon films and silicon germanium films alternatively stacked; and
   the forming of the isolation feature includes forming the isolation feature vertically extending through the plurality of silicon films and silicon germanium films.

6. The method of claim 5, wherein the forming of the gate stack on the active region includes forming a dummy gate on the active region;
   forming an interlevel dielectric layer on the substrate;
   removing the dummy gate;
   selectively etching to remove the silicon germanium films to form a plurality of channels vertically stacked; and
   forming the gate stack surrounding each of the plurality of the channels.

7. The method of claim 6, wherein the forming of the first and second S/D features includes recessing the active region in S/D regions;
   laterally recessing the silicon germanium films;
   forming inner spacers of a third dielectric material on sidewalls of the recessed silicon germanium films; and
   epitaxially growing the first and second S/D features in the S/D regions, wherein the third dielectric material is different from the second dielectric material.

8. The method of claim 1, wherein the forming of the backside via feature includes forming a silicide layer in direct contact with a bottom surface of the second S/D feature; and
   filling a metal on the silicide layer within the trench.

9. The method of claim 8, wherein the forming of the backside metal line includes depositing a backside ILD (BILD) layer;
   patterning the BILD layer to form a line trench to expose the backside via feature; and
   depositing a conductive material in the line trench to form the backside metal line.

10. The method of claim 1, wherein the selectively etching of the active region includes etching the active region within both first and second S/D regions from the back surface, resulting in trenches in the first and second S/D regions;
    refilling a third dielectric material in the trenches;
    forming a mask element with an opening aligned with the second S/D feature; and
    patterning the third dielectric material to expose the second S/D feature through the opening while the first S/D feature remaining covered by the third dielectric material.

11. The method of claim 10, further comprising forming a bottom self-aligned contact layer of a fourth dielectric material disposed on a bottom of the gate stack and aligned with the gate stack, wherein the fourth dielectric material is different from the third dielectric material.

12. A method of forming an integrated circuit structure, comprising:
    receiving a substrate having a front side and a back side;
    forming an active region on the front side of the substrate;
    forming a source/drain (S/D) feature on the active region;
    etching back the active region to form a trench exposing the S/D feature from the back side;
    refilling a first dielectric material layer in the trench;
    patterning the first dielectric material layer to form a backside opening;
    forming, in the backside opening, a liner layer of a second dielectric material; and
    forming a backside via feature landing on the S/D feature within the backside opening.

13. The method of claim 12, wherein the forming of the liner layer includes performing a thermal treatment with nitrogen-containing gas.

14. The method of claim 12, wherein forming of the active region includes forming an isolation feature of a third dielectric material in the substrate, thereby defining the active region surrounded by the isolation feature, wherein the third dielectric material is different from the second dielectric material.

15. The method of claim 14, wherein the liner layer directly contacts sidewalls of the isolation feature and sidewalls of the backside via feature.

16. A method of forming an integrated circuit structure, comprising:
    receiving a substrate having a front side and a back side;
    forming an isolation feature of a first dielectric material in the substrate, thereby defining an active region surrounded by the isolation feature;
    forming a source/drain (S/D) feature on the active region;
    etching back the active region to form a backside trench exposing the S/D feature from the back side;
    forming, in the backside trench, a liner layer of a second dielectric material being different from the first dielectric material of the isolation feature;
    forming a backside via feature landing on the S/D feature within the backside trench; and
    forming a backside metal line landing on the backside via feature.

17. The method of claim 16, wherein the forming of the isolation feature in the substrate includes forming a shallow trench in the substrate;
    filling the first dielectric material; and
    performing a chemical mechanical polishing (CMP) process.

18. The method of claim 16, wherein the first dielectric material includes silicon oxide and the second dielectric material includes silicon nitride.

19. The method of claim 16, further comprising:
    filling a third dielectric layer in the backside trench; and
    patterning the third dielectric layer to form a backside opening, wherein the backside via feature is formed in the backside opening.

20. The method of claim 16, wherein the forming of the backside via feature includes:
    forming a silicide layer in direct contact with a bottom surface of the S/D feature; and
    filling a metal on the silicide layer within the backside trench.

* * * * *